US012810944B2

(12) United States Patent
Kono et al.

(10) Patent No.: US 12,810,944 B2
(45) Date of Patent: Nov. 24, 2026

(54) SEMICONDUCTOR MEMORY DEVICE AND MEMORY SYSTEM

(71) Applicant: Kioxia Corporation, Tokyo (JP)

(72) Inventors: Fumihiro Kono, Yokohama Kanagawa (JP); Takao Nakajima, Yamato Kanagawa (JP); Junji Yamada, Yokohama Kanagawa (JP); Atsushi Okuyama, Kamakura Kanagawa (JP)

(73) Assignee: Kioxia Corporation, Tokyo (JP)

( * ) Notice: Subject to any disclaimer, the term of this patent is extended or adjusted under 35 U.S.C. 154(b) by 44 days.

(21) Appl. No.: 18/883,316

(22) Filed: Sep. 12, 2024

(65) Prior Publication Data

US 2025/0299743 A1 Sep. 25, 2025

(30) Foreign Application Priority Data

Mar. 19, 2024 (JP) ................................ 2024-044085

(51) Int. Cl.

*G11C 16/04* (2006.01)
*G11C 16/26* (2006.01)
*G11C 16/30* (2006.01)
*H10B 41/35* (2023.01)
*H10B 43/35* (2023.01)

(52) U.S. Cl.

CPC .......... *G11C 16/26* (2013.01); *G11C 16/0483* (2013.01); *G11C 16/30* (2013.01); *H10B 41/35* (2023.02); *H10B 43/35* (2023.02)

(58) Field of Classification Search

CPC ...... G11C 16/26; G11C 16/0483; G11C 16/30
USPC .................................................. 365/189.011
See application file for complete search history.

(56) References Cited

U.S. PATENT DOCUMENTS

| | | | | |
|---|---|---|---|---|
| 10,725,909 | B2 * | 7/2020 | Yanagidaira | G06F 12/0653 |
| 2013/0286750 | A1 * | 10/2013 | Ishikawa | G11C 5/02 365/189.03 |
| 2020/0160917 | A1 * | 5/2020 | Kitani | G11C 16/10 |
| 2020/0401339 | A1 | 12/2020 | Sun | |
| 2021/0210150 | A1 | 7/2021 | Kondo | |
| 2022/0093194 | A1 | 3/2022 | Lee | |
| 2023/0298641 | A1 | 9/2023 | Hayashi | |
| 2024/0204760 | A1 * | 6/2024 | Kim | G11C 16/10 |

FOREIGN PATENT DOCUMENTS

JP 2023-137230 A 9/2023

* cited by examiner

*Primary Examiner* — Ly D Pham
(74) *Attorney, Agent, or Firm* — Kim & Stewart LLP

(57) ABSTRACT

A semiconductor memory device capable of improving the usage efficiency of a bus is provided. The semiconductor memory device includes a data storage unit, a data transfer circuit, and a control circuit. The data storage unit temporarily stores data read from a memory cell array. The data transfer circuit is provided between the data storage unit and an input/output pad, and transfers the data stored in the data storage unit to the input/output pad. When a predetermined time period elapses without the data transfer circuit starting data transfer to the memory controller through the input/output pad, the control circuit cuts off power supplied to the data transfer circuit. The predetermined time period can be changed according to an instruction from the memory controller.

20 Claims, 17 Drawing Sheets

SEMICONDUCTOR MEMORY DEVICE AND MEMORY SYSTEM

CROSS-REFERENCE TO RELATED APPLICATION(S)

This application is based upon and claims the benefit of priority from Japanese Patent Application No. 2024-044085, filed Mar. 19, 2024, the entire contents of which are incorporated herein by reference.

FIELD

Embodiments described herein relate generally to a semiconductor memory device and a memory system.

BACKGROUND

A NAND flash memory is known as a type of semiconductor memory device.

DETAILED DESCRIPTION

Embodiments provide a semiconductor memory device and a memory system capable of improving the usage efficiency of a bus.

In general, according to one embodiment, a semiconductor memory device includes a memory cell array, a data storage unit, a pad portion, a data transfer circuit, and a control circuit. The data storage unit temporarily stores data read from the memory cell array. The data transfer circuit is provided between the data storage unit and the pad portion, and transfers data stored in the data storage unit to an input/output pad of the pad portion. When a predetermined time period has elapsed without the data transfer circuit starting transfer of data to the memory controller through the input/output pad, the control circuit cuts off power supplied to the data transfer circuit. The predetermined time period can be changed according to an instruction from the memory controller.

According to another embodiment, a memory system includes a semiconductor memory device, and a memory controller that controls the semiconductor memory device based on a request from a host. The memory controller outputs a recommended value for the predetermined time period to the host.

Hereinafter, embodiments will be described with reference to the drawings. In order to facilitate understanding of the description, the same components will be denoted by the same signs in each figure to the extent possible, and an overlapping description will be omitted.

1. Embodiments

A semiconductor memory device of an embodiment will be described. The semiconductor memory device according to the present embodiment is a non-volatile memory device configured as a NAND flash memory.

1.1 Configuration of Memory System

First, the configuration of a memory system of the present embodiment will be described.

Figure 1:
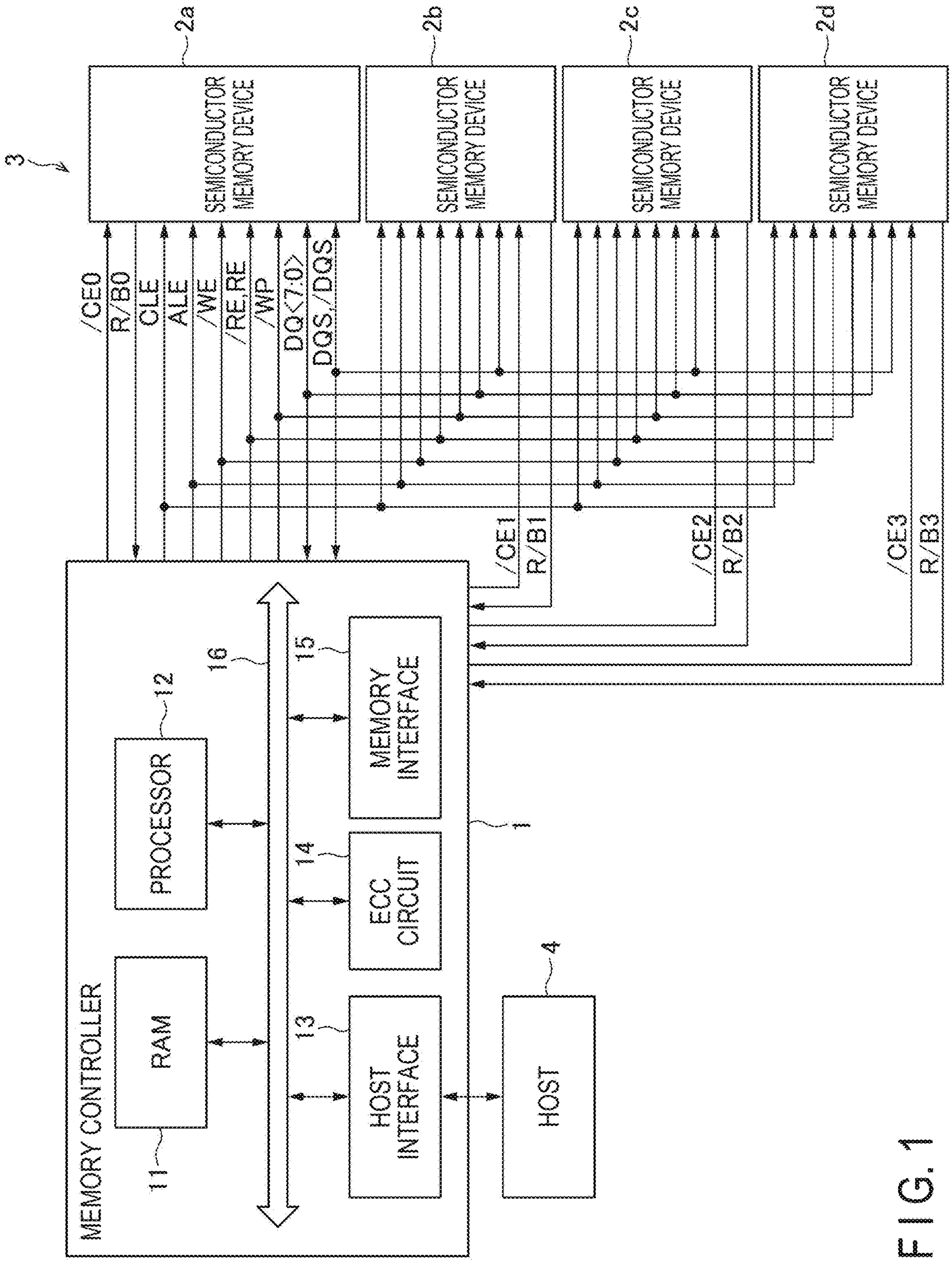
FIG. 1 is a block diagram illustrating the schematic configuration of a memory system of an embodiment.

As illustrated in FIG. 1, a memory system 3 of the present embodiment includes a memory controller 1 and semiconductor memory devices 2*a* to 2*d*. The semiconductor memory devices 2*a* to 2*d* are non-volatile memory devices configured as NAND flash memories. The memory system 3 can be connected to a host 4. The host 4 is electronic equipment such as a personal computer and a mobile terminal.

The memory controller 1 controls writing of data to the semiconductor memory devices 2*a* to 2*d* according to a write request from the host 4. Additionally, the memory controller 1 controls the output of data from the semiconductor memory devices 2*a* to 2*d* to the memory controller 1 according to a read request from the host 4.

Each of signals, i.e., a chip enable signal /CE, a ready busy signal R/B, a command latch enable signal CLE, an address latch enable signal ALE, a write enable signal /WE, read enable signals /RE and RE, a write protect signal /WP, a signal DQ<7:0>, and data strobe signals DQS and/DQS, is transmitted and received between the memory controller 1 and the semiconductor memory devices 2*a* to 2*d*.

The chip enable signal /CE is a signal for enabling the semiconductor memory devices 2*a* to 2*d*. The ready busy signal R/B is a signal for indicating whether the semiconductor memory devices 2*a* to 2*d* are in a ready state or in a busy state. The "ready state" is a state where an instruction from the outside can be received. The "busy state" is a state where an instruction from the outside cannot be received.

As illustrated in FIG. 1, chip enable signals /CE are individually transmitted to the plurality of semiconductor memory devices 2*a* to 2*d*, respectively. In FIG. 1, a number is added to the end, for example, "/CE0", so that each chip enable signal /CE can be distinguished from each other.

Similarly, ready busy signals R/B are individually transmitted from the plurality of semiconductor memory devices 2*a* to 2*d*. In FIG. 1, a number is added to the end, for example, "R/B0", so that each ready busy signal R/B can be distinguished from each other.

Signals (the command latch enable signal CLE and the like) other than the chip enable signal /CE and the ready busy signal R/B are transmitted and received between the memory controller 1 and the semiconductor memory devices 2*a* to 2*d* via a signal line that is common among the plurality of semiconductor memory devices 2*a* to 2*d*. The memory controller 1 targets one of the semiconductor memory devices 2*a* to 2*d* to communicate with using individual chip enable signals /CE.

The command latch enable signal CLE is a signal indicating that the signal DQ<7:0> is a command. The address latch enable signal ALE is a signal indicating that the signal DQ<7:0> is an address. The write enable signal /WE is a signal for the semiconductor memory devices 2*a* to 2*d* to capture the signal DQ<7:0> received thereby, and is asserted whenever the memory controller 1 outputs a command, an address, and data. The semiconductor memory devices 2*a* to 2*d* captures the signal DQ<7:0> when the signal /WE is at a "L (Low)" level.

The read enable signals/RE and RE are signals for the memory controller 1 to instruct the semiconductor memory devices 2*a* to 2*d* to output data to the memory controller 1. The read enable signals RE and/RE are used for controlling the operation timing of the semiconductor memory devices 2*a* to 2*d* at the time of outputting, for example, the signal DQ<7:0>. The write protect signal /WP is a signal for instructing prohibition of data writing and erasing to the semiconductor memory devices 2*a* to 2*d*. The signal DQ<7:0> contains data transmitted and received between the semiconductor memory devices 2*a* to 2*d* and the memory controller 1, and includes a command, an address, and other types of data. The data strobe signals DQS and/DQS are signals for controlling the timing of input/output of the signal DQ<7:0>.

The memory controller 1 includes a RAM 11, a processor 12, a host interface 13, an ECC circuit 14, and a memory interface 15. These are connected to each other by an internal bus 16.

The host interface 13 outputs a request, user data (including write data), and the like that are received from the host 4 to the internal bus 16. Additionally, the host interface 13 transmits, to the host, user data read from the semiconductor memory devices 2*a* to 2*d*, and a response and the like from the processor 12.

The memory interface 15 controls processing of writing user data and the like to the semiconductor memory devices 2*a* to 2*d*, and processing of reading from the semiconductor memory devices 2*a* to 2*d*, based on an instruction from the processor 12.

The processor 12 comprehensively controls the memory controller 1. The processor 12 is a CPU, an MPU, or the like. When a request is received via the host interface 13 from the host 4, the processor 12 performs control according to the request. For example, the processor 12 instructs the memory interface 15 to write user data and parity to the semiconductor memory devices 2*a* to 2*d*, according to a request from the host 4. Additionally, the processor 12 instructs the memory interface 15 to read user data and parity from the semiconductor memory devices 2*a* to 2*d*, according to a request from the host 4.

The processor 12 determines storage areas (also referred to as "memory areas") on the semiconductor memory device 2*a* to 2*d* for user data stored in the RAM 11. The user data stored in the RAM 11 is transferred via the internal bus 16. The processor 12 performs the determination of the memory areas for data in units of pages (page data), which are units of writing. The user data stored in one page of the semiconductor memory devices 2*a* to 2*d* is hereinafter also referred to as "unit data". The unit data is generally encoded and stored in the semiconductor memory devices 2*a* to 2*d* as code words. In the present embodiment, encoding is optional. Although the memory controller 1 may store unit data in the semiconductor memory devices 2*a* to 2*d* without encoding, FIG. 1 illustrates the configuration in which encoding is performed as an example. When the memory controller 1 does not perform encoding, page data matches unit data. Additionally, one code word may be generated based on one piece of unit data, or one code word may be generated based on divided data obtained by dividing unit data. Additionally, one code word may be generated using a plurality of pieces of unit data.

The processor 12 determines, for each unit data, a memory area of the semiconductor memory devices 2*a* to 2*d* to which unit data is to be written. Physical addresses are assigned to memory areas of the semiconductor memory devices 2*a* to 2*d*. The processor 12 manages a memory area to which unit data is to be written, by using a physical address. The processor 12 instructs the memory interface 15 to write user data to the semiconductor memory devices 2*a* to 2*d* by specifying the determined memory area using a physical address. The processor 12 manages the correspondence between the logical address (which is, e.g., a logical address managed by the host 4) and the physical address of user data. When the processor 12 receives a read request including a logical address from the host 4, the processor 12 identifies the physical address corresponding to the logical address, and instructs the memory interface 15 to read user data by specifying the physical address.

The ECC circuit 14 encodes user data stored in the RAM 11 to generate code words. Additionally, the ECC circuit 14 decodes code words read from the semiconductor memory devices 2*a* to 2*d*.

The RAM 11 temporarily stores user data received from the host 4 until the user data is stored in the semiconductor memory devices 2*a* to 2*d*, and temporarily stores data read from the semiconductor memory devices 2*a* to 2*d* until the data is transmitted to the host 4. The RAM 11 is, for example, a general-purpose memory such as an SRAM and a DRAM.

FIG. 1 illustrates the configuration example in which the memory controller 1 includes the ECC circuit 14 and the memory interface 15. However, the ECC circuit 14 may be built in the memory interface 15. Additionally, the ECC circuit 14 may be built in the semiconductor memory devices 2*a* to 2*d*. The specific configuration and arrangement of each element illustrated in FIG. 1 are not particularly limited to the illustrated configuration and arrangement.

When a write request is received from the host 4, the memory system 3 in FIG. 1 operates as follows. The processor 12 causes the RAM 11 to temporarily store data to be written. The processor 12 reads the data stored in the RAM 11, and inputs the data to the ECC circuit 14. The ECC circuit 14 encodes the input data, and inputs a code word to the memory interface 15. The memory interface 15 writes the input code word to the semiconductor memory devices 2*a* to 2*d*.

When a read request is received from the host 4, the memory system 3 in FIG. 1 operates as follows. The memory interface 15 inputs a code word read from the semiconductor memory devices 2*a* to 2*d* to the ECC circuit 14. The ECC circuit 14 decodes the input code word, and stores the decoded data in the RAM 11. The processor 12 transmits the data stored in the RAM 11 to the host 4 via the host interface 13.

1.2 Schematic Configuration of Semiconductor Memory Device

Next, the schematic configurations of the semiconductor memory devices 2*a* to 2*d* will be described. Note that, since each of the semiconductor memory devices 2*a* to 2*d* has the same structure, the structure of the semiconductor memory device 2*a* will be described below as a representative.

Figure 2:
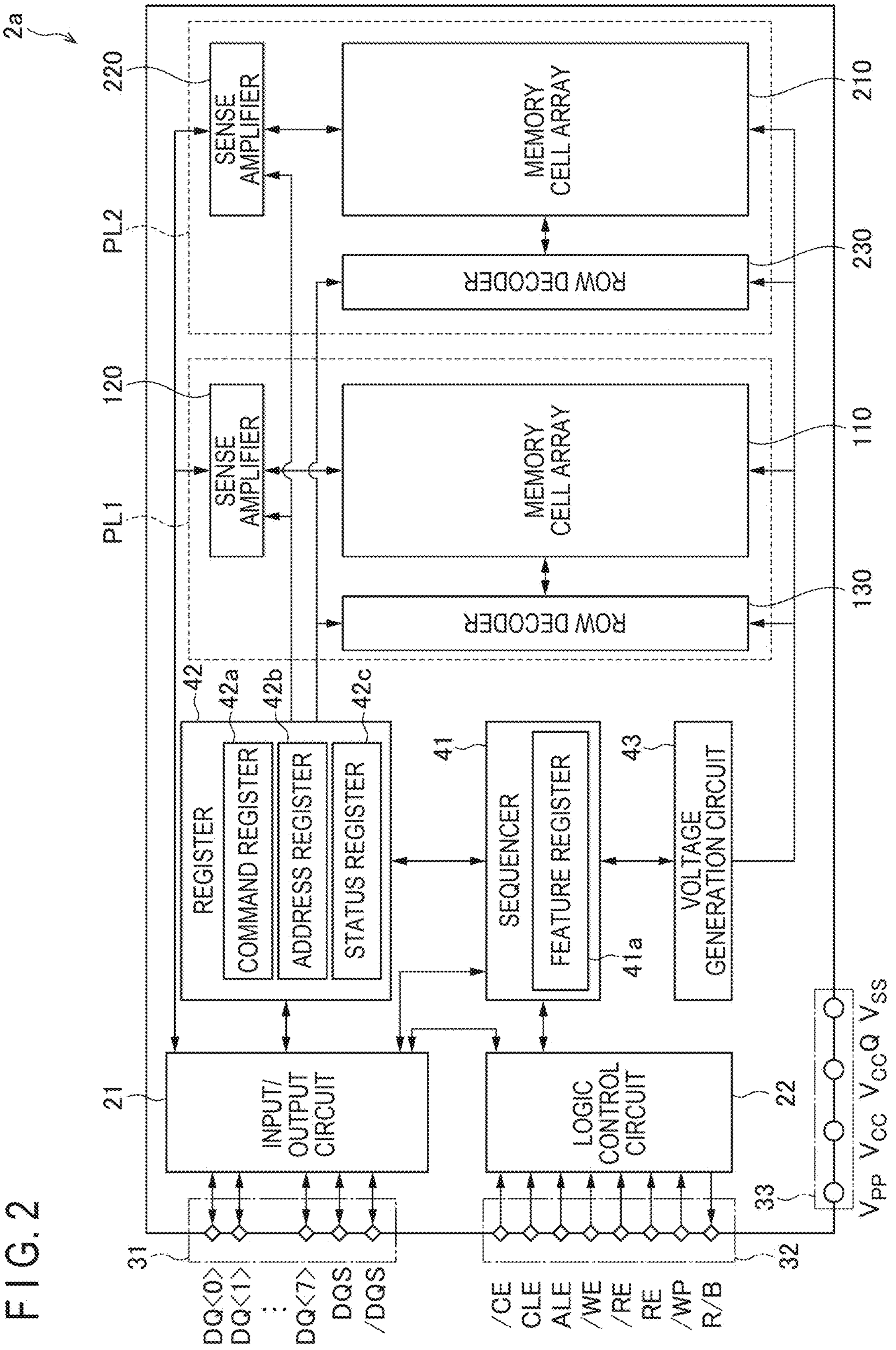
FIG. 2 is a block diagram illustrating the schematic configuration of a semiconductor memory device of the embodiment.

As illustrated in FIG. 2, the semiconductor memory device 2*a* includes two planes PL1 and PL2, an input/output circuit 21, a logic control circuit 22, a sequencer 41, a register 42, a voltage generation circuit 43, an input/output pad group 31, a logic control pad group 32, and a power supply input terminal group 33.

The plane PL1 includes a memory cell array 110, a sense amplifier 120, and a row decoder 130. The plane PL2 includes a memory cell array 210, a sense amplifier 220, and a row decoder 230. The configuration of the plane PL1 and the configuration of the plane PL2 are the same. That is, the configuration of the memory cell array 110 and the configuration of the memory cell array 210 are the same, the configuration of the sense amplifier 120 and the configuration of the sense amplifier 220 are the same, and the configuration of the row decoder 130 and the configuration of the row decoder 230 are the same. Although the number of the planes provided in the semiconductor memory device 2*a* may be two as in the present embodiment, the number of the planes may be one, or may be three or more.

The memory cell arrays 110 and 210 are parts that store data. Each of the memory cell arrays 110 and 210 includes a plurality of memory cell transistors associated with word lines and bit lines.

The row decoders 130 and 230 are circuits made up of a switch group for applying a voltage to each of the plurality of word lines of the memory cell arrays 110 and 210. The row decoders 130 and 230 receive a block address and a row address from the register 42, select a block based on the block address, and select a word line based on the row address. The row decoders 130 and 230 switch the open/close state of the switch group so that the voltage from the voltage generation circuit 43 is applied to the selected word line. The operations of the row decoders 130 and 230 are controlled by the sequencer 41.

The sense amplifiers 120 and 220 are circuits for adjusting the voltage applied to the bit lines of the memory cell arrays 110 and 210, and reading the voltage of the bit lines to convert the voltage to data. At the time of reading of data, the sense amplifiers 120 and 220 determine data stored in the memory cell transistors of the memory cell arrays 110 and 210 based on the voltage of the bit lines, and transfer the determined read data to the input/output circuit 21. At the time of writing of data, the sense amplifiers 120 and 220 control the voltage of the bit lines based on the data to be written to the memory cell transistors. The operations of the sense amplifiers 120 and 220 are controlled by the sequencer 41.

The input/output circuit 21 transmits and receives the signal DQ<7:0> and the data strobe signals DQS and/DQS to and from the memory controller 1. The input/output circuit 21 transfers a command and an address in the signal DQ<7:0> to the register 42. Additionally, the input/output circuit 21 transmits and receives write data and read data to and from the sense amplifier 120 and the sense amplifier 220. The input/output circuit 21 has both a function of an "input circuit" that receives a command, an address, and data from the memory controller 1, and a function of an "output circuit" that outputs data to the memory controller 1. Instead of such a configuration, the input circuit and the output circuit may be configured as separate circuits.

The logic control circuit 22 receives from the memory controller 1, the chip enable signal /CE, the command latch enable signal CLE, the address latch enable signal ALE, the write enable signal /WE, the read enable signals /RE and RE, and the write protect signal /WP. Additionally, the logic control circuit 22 transfers the ready busy signal R/B to the memory controller 1, and notifies the memory controller 1 of the ready/busy state of the semiconductor memory device 2*a*.

Each of the input/output circuit 21 and the logic control circuit 22 is a circuit configured as a part to/from which signals are input/output from/to the memory controller 1. That is, the input/output circuit 21 and the logic control circuit 22 are provided as interface circuits of the semiconductor memory device 2*a*.

The sequencer 41 is a circuit that controls the operation of each of various parts of the semiconductor memory device 2*a*, e.g., the planes PL1 and PL2, the voltage generation circuit 43, and the like, based on a control signal that is input to the semiconductor memory device 2*a* from the memory controller 1. The sequencer 41 is a part that controls the operations of memory cell arrays 110 and 210, and the like. In the present embodiment, the sequencer 41 is an example of a control unit of the semiconductor memory device 2*a*. Note that both the sequencer 41 and the logic control circuit 22 can also be considered as the control unit.

The sequencer 41 has a feature register 41*a*. The feature register 41*a* is a part that stores an operation parameter of the semiconductor memory device 2*a*. The operation parameter can be set by a set feature (SetFeature) operation, which will be described later.

The register 42 includes a command register 42*a*, an address register 42*b*, and a status register 42*c*. The command register 42*a* is a part that temporarily stores a command. The address register 42*b* is a part that temporarily stores an address. The status register 42*c* is a part that stores the status information indicating the state of the semiconductor memory device 2*a*. More specifically, the status register 42*c* is a part that stores the status information indicating the state of each of the planes PL1 and PL2. The status information is output to the memory controller 1 from the input/output circuit 21 as a state signal, according to a request from the memory controller 1.

The voltage generation circuit 43 is a part that generates voltages required for a write operation, a read operation, and an erase operation of data in the memory cell arrays 110 and 210, respectively, based on an instruction from the sequencer 41. Such voltages include, for example, voltages applied to the plurality of word lines and the plurality of bit lines of the memory cell arrays 110 and 210, respectively. The voltage generation circuit 43 can independently apply a voltage to each of the word lines, the bit lines, and the like, so that the plane PL1 and the plane PL2 can operate in parallel with each other.

The input/output pad group 31 is a portion provided with a plurality of terminals (pads) for transmitting and receiving each signal between the memory controller 1 and the input/output circuit 21. The terminals are individually provided so as to correspond to the signal DQ<7:0> and the data strobe signals DQS and/DQS, respectively. In the present embodiment, the input/output pad group 31 is an example of a pad portion.

The logic control pad group 32 is a portion provided with a plurality of terminals (pads) for transmitting and receiving each signal between the memory controller 1 and the logic control circuit 22. The terminals are individually provided so as to correspond to the chip enable signal /CE, the command latch enable signal CLE, the address latch enable signal ALE, the write enable signal /WE, the read enable signals /RE and RE, the write protect signal /WP, and the ready busy signal R/B, respectively.

The power supply input terminal group 33 is a portion provided with a plurality of terminals for receiving application of each voltage required for the operation of the semiconductor memory device 2*a*. Power supply voltages VCC, VCCQ, and VPP, and a ground voltage VSS are included in the voltages applied to each of the terminals. The power supply voltage VCC is a circuit power supply voltage given from the outside as an operating power supply, and is a voltage of, for example, about 2.5 V. The power supply voltage VCC is, for example, the voltage for generating a voltage VDD, which is the internal power supply voltage of the semiconductor memory device 2*a*. The power supply voltage VDD is a voltage of, for example, about 1.5 V. The power supply voltage VCCQ is a power supply voltage lower than the power supply voltage VCC, and is a voltage of, for example, 1.2 V. The power supply voltage VCCQ is an input/output power supply voltage that is used when transmitting and receiving signals between the memory controller 1 and the semiconductor memory device 2*a*.

1.3 Circuit Configuration of Memory Cell Array

Next, the circuit configuration of the memory cell array 110 will be described.

Figure 3:
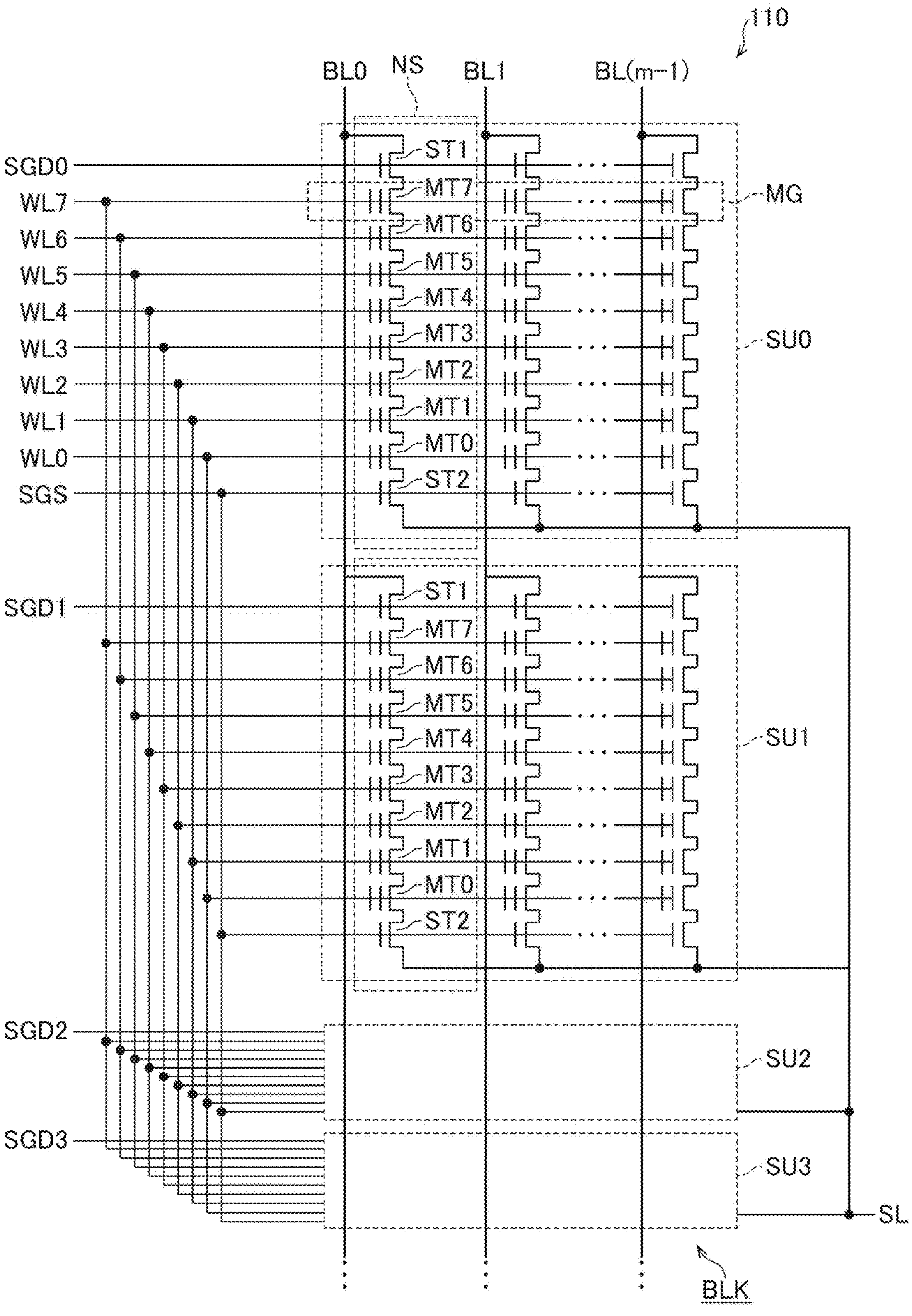
FIG. 3 is a circuit diagram illustrating the configuration of the semiconductor memory device of the embodiment.

The memory cell array 110 includes a plurality of blocks BLK. FIG. 3 only illustrates one of the plurality of blocks BLK. The configurations of the other blocks BLK included in the memory cell array 110 are the same as the configuration illustrated in FIG. 3.

As illustrated in FIG. 3, the block BLK includes, for example, four string units SU (SU0 to SU3). Additionally, each of the string units SU includes a plurality of NAND strings NS. Each of the NAND strings NS includes, for example, eight memory cell transistors MT (MT0 to MT7), and selection transistors ST1 and ST2.

The memory cell transistors MT are arranged so as to be connected in series between the selection transistor ST1 and the selection transistor ST2. The memory cell transistor MT7 on one end side is connected to a source of the selection transistor ST1, and the memory cell transistor MT0 on the other end side is connected to a drain of the selection transistor ST2.

The gates of the selection transistors ST1 of each of the string units SU0 to SU3 are commonly connected to respective selection gate lines SGD0 to SGD3. The gates of the selection transistors ST2 are commonly connected to the same select gate line SGS across the plurality of string units SU in the same block BLK. The gates of the memory cell transistors MT0 to MT7 in the same block BLK are commonly connected to word lines WL0 to WL7, respectively. That is, while the word lines WL0 to WL7 and the select gate line SGS are common across the plurality of string units SU0 to SU3 in the same block BLK, the select gate line SGD is individually provided for each of the string units SU0 to SU3, even in the same block BLK.

The memory cell array 110 is provided with m bit lines BL (BL0, BL1, . . . , BL(m−1)), where "m" is an integer corresponding to the number of the NAND strings NS included in one string unit SU. The drain of the selection transistor ST1 of each of the NAND strings NS is connected to the corresponding bit line BL. The source of the selection transistor ST2 of each of the NAND strings NS is connected to a source line SL. The source line SL is common to the sources of the plurality of selection transistors ST2 included in the block BLK.

The data stored in the plurality of memory cell transistors MT in the same block BLK is collectively erased. On the other hand, reading and writing of data are collectively performed on the plurality of memory cell transistors MT that are connected to one word line WL, and that belong to one string unit SU. Each memory cell can store n-bit data, consisting of a higher-order bit, a middle-order bit, and a lower-order bit in the present embodiment because n is 3.

In other words, the semiconductor memory device 2*a* of the present embodiment adopts the TLC scheme that stores 3-bit data per memory cell transistor MT as a scheme for writing data to the memory cell transistor MT. Instead of such a mode, the MLC scheme that stores 2-bit data per memory cell transistor MT, or the like may be adopted as the scheme for writing data to the memory cell transistor MT. The number of bits of data stored in one memory cell transistor MT is not particularly limited to any one number.

Note that, in the following description, a set of 1-bit data stored in the plurality of memory cell transistors MT that are connected to one word line WL, and that belong to one string unit SU is referred to as a "page". In FIG. 3, one of such sets of the plurality of memory cell transistors MT is denoted by a label "MG".

When 3-bit data is stored in one memory cell transistor MT as in the present embodiment, a set of the plurality of memory cell transistors MT connected to a common word line WL in one string unit SU can store data for 3 pages. Among these, a page consisting of a set of lower-order bit data is hereinafter also referred to as a "lower-order page", and the data of the lower-order page is also referred to as "lower-order page data". Similarly, a page consisting of a set of middle-order bit data is hereinafter also referred to as a "middle-order page", and the data of the middle-order page is hereinafter also referred to as "middle-order page data". A page consisting of a set of higher-order bit data is hereinafter also referred to as a "higher-order page", and the data of the higher-order page is hereinafter also referred to as "higher-order page data".

1.4 Cross-sectional Structure of Semiconductor Memory Device

Next, the memory cell array 110 and its peripheral structure will be described.

Figure 4:
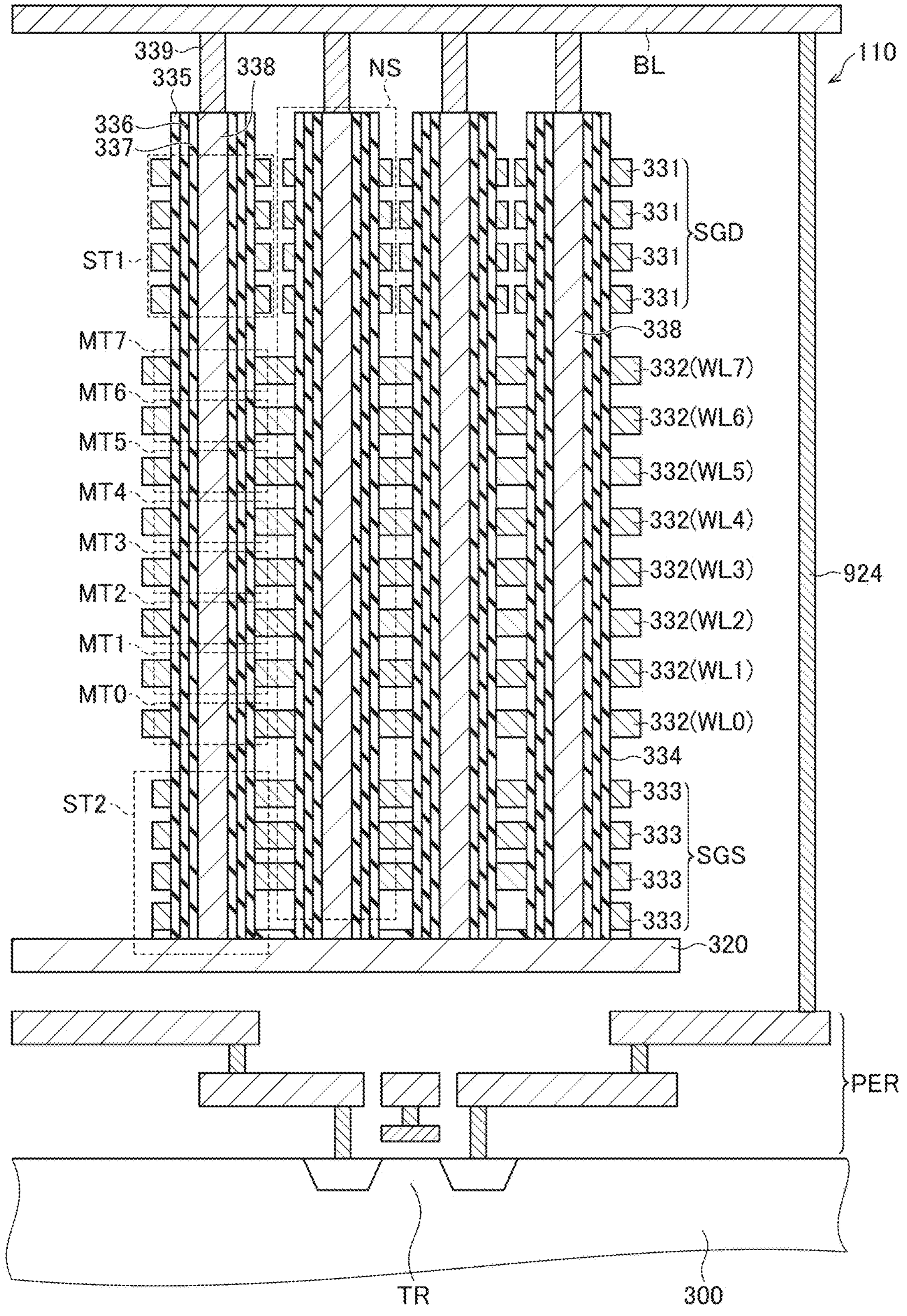
FIG. 4 is a cross-sectional view illustrating a cross-sectional structure of the semiconductor memory device of the embodiment.

As illustrated in FIG. 4, in the memory cell array 110, the plurality of NAND strings NS are formed on a conductive layer 320. The conductive layer 320 is also referred to as a buried source line (BSL), and corresponds to the source line SL illustrated in FIG. 3.

A plurality of wiring layers 333 that function as the select gate lines SGS, a plurality of wiring layers 332 that function as the word lines WL, and a plurality of wiring layers 331 that function as the select gate lines SGD are stacked above the conductive layer 320. An insulating layer, which is not illustrated, is arranged between each of the stacked wiring layers 333, 332, and 331.

A plurality of memory holes 334 are formed in the memory cell array 110. The memory holes 334 are holes that penetrate the above-described wiring layers 333, 332, and 331 and the insulating layers, which are not illustrated, in an up-down direction, and that reach the conductive layer 320. A block insulating film 335, an electric charge accumulation layer 336, and a gate insulating film 337 are sequentially formed on a side surface of the memory hole 334, and a conductive column 338 is further embedded inside them. The conductive column 338 is made of, for example, polysilicon, and functions as an area in which a channel is formed at the time of the operation of the memory cell transistors MT and the selection transistors ST1 and ST2 included in the NAND string NS. In this manner, a columnar body consisting of the block insulating film 335, the electric charge accumulation layer 336, the gate insulating film 337, and the conductive column 338 is formed inside the memory hole 334.

Each portion of the columnar body formed inside the memory hole 334 that crosses the stacked wiring layers 333, 332, and 331 functions as a transistor. Among these transistors, the transistors in the portions that cross the wiring layers 331 function as the selection transistor ST1. Among these transistors, the transistors in the portions that cross the wiring layers 332 function as the memory cell transistors MT (MT0 to MT7). Among these transistors, the transistors in the portions that cross the wiring layers 333 function as the selection transistor ST2. With such a configuration, each columnar body formed inside each memory hole 334 functions as the NAND string NS illustrated in FIG. 3. The conductive column 338 inside the columnar body is a part that functions as a channel of the memory cell transistors MT, and the selection transistors ST1 and ST2.

A wiring layer that functions as the bit line BL is formed above the conductive column 338. A contact plug 339 that connects the conductive column 338 and the bit line BL is formed at an upper end of the conductive column 338.

A plurality of configurations similar to the configuration illustrated in FIG. 4 are arranged along the depth direction of the paper surface of FIG. 4. One string unit SU is formed by a set of a plurality of NAND strings NS arranged in line along the depth direction of the paper surface of FIG. 4.

In the semiconductor memory device 2*a* of the present embodiment, a peripheral circuit PER is provided below the memory cell array 110, that is, at a position between the memory cell array 110 and a semiconductor substrate 300. The peripheral circuit PER is a circuit provided for performing a write operation, a read operation, an erase operation, and the like of data in the memory cell array 110. The sense amplifier 120, the row decoder 130, the voltage generation circuit 43, and the like illustrated in FIG. 2 are a part of the peripheral circuit PER. The peripheral circuit PER includes various kinds of transistors, RC circuits, and the like. In the example illustrated in FIG. 4, the transistor TR formed on the semiconductor substrate 300 and the bit line BL above the memory cell array 110 are electrically connected via a contact 924.

1.5 Configuration of Sense Amplifier

Next, the circuit configuration of the sense amplifier 120 will be described.

Figure 5:
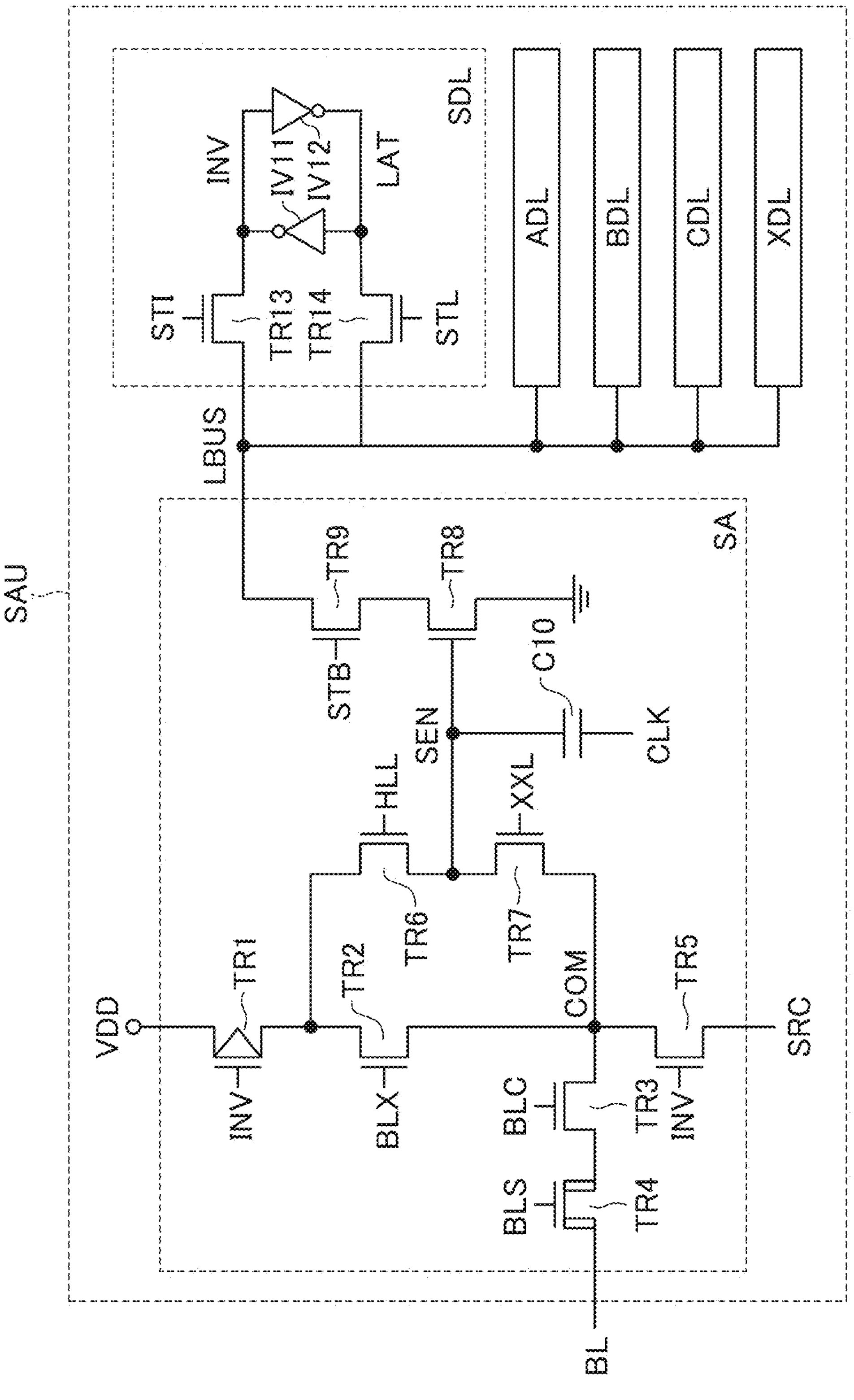
FIG. 5 is a block diagram illustrating the configuration of a sense amplifier unit of the embodiment.

The sense amplifier 120 includes a plurality of sense amplifier units associated with the plurality of bit lines BL, respectively. FIG. 5 illustrates the circuit configuration of one of these sense amplifier units SAU.

As illustrated in FIG. 5, the sense amplifier unit SAU includes a sense amplifier unit SA, and latch circuits SDL, ADL, BDL, CDL and XDL. The sense amplifier unit SA and the latch circuits SDL, ADL, BDL, CDL, and XDL are connected by a bus LBUS, so that data can be transmitted to and received from each other.

For example, in a read operation, the sense amplifier unit SA senses data stored in a memory cell transistor using the corresponding bit line BL, and determines whether the data is "0" or "1". The sense amplifier unit SA includes, for example, a transistor TR1, which is a p-channel MOS transistor, transistors TR2 to TR9, which are n-channel MOS transistors, and a capacitor C10.

One end of the transistor TR1 is connected to a power supply line, and the other end of the transistor TR1 is connected to the transistor TR2. The gate of the transistor TR1 is connected to a node INV in the latch circuit SDL. One end of the transistor TR2 is connected to the transistor TR1, and the other end of the transistor TR2 is connected to a node COM. A signal BLX is input to the gate of the transistor TR2. One end of the transistor TR3 is connected to the node COM, and the other end of the transistor TR3 is connected to the transistor TR4. A signal BLC is input to the gate of the transistor TR3. The transistor TR4 is a high-voltage MOS transistor. One end of the transistor TR4 is connected to the transistor TR3. The other end of the transistor TR4 is connected to the corresponding bit line BL. A signal BLS is input to the gate of the transistor TR4.

One end of the transistor TR5 is connected to the node COM, and the other end of the transistor TR5 is connected to a node SRC. The gate of the transistor TR5 is connected to the node INV. One end of the transistor TR6 is connected between the transistor TR1 and the transistor TR2, and the other end of the transistor TR6 is connected to a node SEN. A signal HLL is input to the gate of the transistor TR6. One end of the transistor TR7 is connected to the node SEN, and the other end of the transistor TR7 is connected to the node COM. A signal XXL is input to the gate of the transistor TR7.

One end of the transistor TR8 is grounded, and the other end of the transistor TR8 is connected to the transistor TR9. The gate of the transistor TR8 is connected to the node SEN. One end of the transistor TR9 is connected to the transistor TR8, and the other end of the transistor TR9 is connected to the bus LBUS. A signal STB is input to the gate of the transistor TR9. One end of the capacitor C10 is connected to the node SEN. A clock CLK is input to the other end of the capacitor C10.

The signals BLX, BLC, BLS, HLL, XXL, and STB are generated by, for example, the sequencer 41. Additionally, for example, the voltage VDD, which is the internal power supply voltage of the semiconductor memory device 2*a*, is applied to the power supply line connected to the one end of the transistor TR1, and for example, the voltage VSS, which is the ground voltage of the semiconductor memory device 2*a*, is applied to the node SRC.

The latch circuits SDL, ADL, BDL, CDL, and XDL temporarily store read data. The latch circuit XDL is connected to the input/output circuit 21, and is used for input/output of data between the sense amplifier unit SAU and the input/output circuit 21. The read data is stored in the latch circuit XDL to be in a state where the read data can be output to the memory controller 1 from the input/output circuit 21. For example, the data read by the sense amplifier unit SAU is stored in any of the latch circuits ADL, BDL, and CDL, thereafter transferred to the latch circuit XDL, and output from the latch circuit XDL to the input/output circuit 21. Additionally, for example, the data input to the input/output circuit 21 from the memory controller 1 is transferred from the input/output circuit 21 to the latch circuit XDL, and is transferred from the latch circuit XDL to any of the latch circuits ADL, BDL, and CDL. In the present embodiment, the latch circuit XDL is an example of a data storage unit.

The latch circuit SDL includes, for example, inverters IV11 and IV12, and transistors TR13 and TR14, which are n-channel MOS transistors. An input node of the inverter IV11 is connected to a node LAT. An output node of the inverter IV11 is connected to the node INV. An input node of the inverter IV12 is connected to the node INV. An output node of the inverter IV12 is connected to the node LAT. One end of the transistor TR13 is connected to the node INV, and the other end of the transistor TR13 is connected to the bus LBUS. A signal ST1 is input to the gate of the transistor TR13. One end of the transistor TR14 is connected to the node LAT, and the other end of the transistor TR14 is connected to the bus LBUS. A signal STL is input to the gate of the transistor TR14. For example, the data stored in the node LAT corresponds to the data stored in the latch circuit SDL. Additionally, the data stored in the node INV corresponds to the inverted data of the data stored in the node LAT. Since the circuit configurations of the latch circuits ADL, BDL, CDL, and XDL are similar to the circuit configuration of the latch circuit SDL, a description will be omitted.

1.6 Threshold Value Distribution of Memory Cell Transistor

Next, the threshold value distribution of the memory cell transistor MT will be described.

Figure 6:
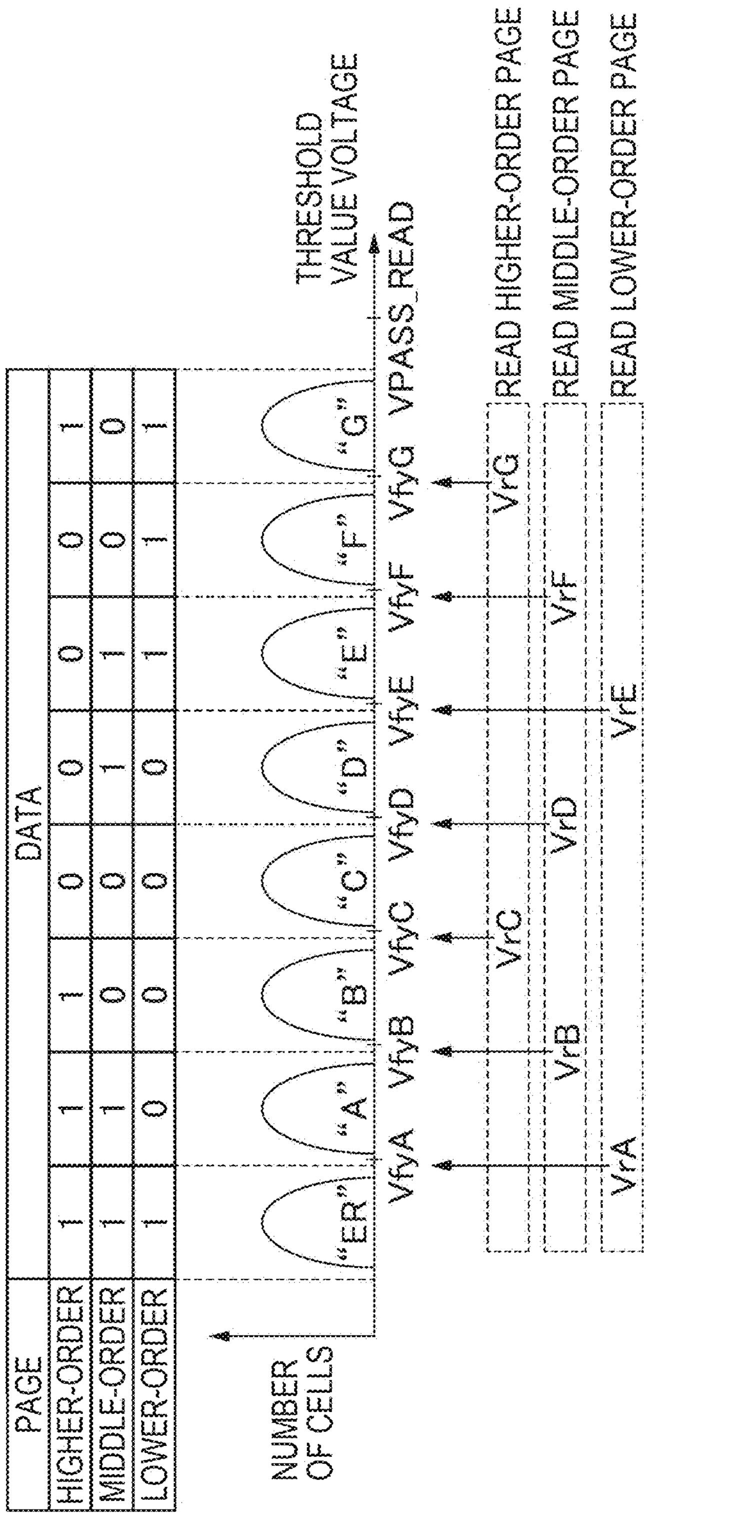
FIG. 6 is a diagram illustrating an example of the threshold value distribution of a memory cell transistor.

FIG. 6 is a diagram schematically illustrating the threshold value distribution and the like of the memory cell transistors MT. The diagram in the middle of FIG. 6 represents the corresponding relationship between the threshold value voltage (horizontal axis) of the memory cell transistors MT, and the number (vertical axis) of the memory cell transistors MT.

When the TLC scheme is adopted as in the present embodiment, the plurality of memory cell transistors MT form eight threshold value distributions as illustrated in the middle of FIG. 6. These eight threshold value distributions (referred to as write states) are sequentially referred to as an “ER” state, an “A” state, a “B” state, a “C” state, a “D” state, an “E” state, an “F” state, and a “G” state from the lowest threshold value voltage. The table at the top of FIG. 6 represents an example of 3-bit data assigned to each state of the threshold value voltage.

In this manner, the threshold value voltage of the memory cell transistors MT in the present embodiment may be in one of eight candidate states, and the data is assigned corresponding to each of the candidate states as described above.

Read voltages to be used in read operations are set between adjacent threshold value distributions, respectively. The “read voltage” is a voltage applied to the word line WL connected to the memory cell transistor MT to be read at the time of a read operation, that is, a selected word line. In the read operation, data is determined based on a determination result of whether or not the threshold value voltage of the memory cell transistor MT to be read is higher than the applied read voltage. For example, as schematically illustrated in the diagram at the bottom of FIG. 6, a read voltage VrA that determines whether the threshold value voltage of the memory cell transistor MT is included in the “ER” state or the “A” state is set between the maximum threshold value voltage of the “ER” state and the minimum threshold value voltage of the “A” state. The other read voltages VrB, VrC, VrD, VrE, VrF, and VrG are also set in a manner similar to the above-described read voltage VrA.

A read path voltage VPASS_READ is set to a voltage higher than the maximum threshold value voltage of the highest threshold value distribution (for example, the “G” state). The memory cell transistor MT to which the read path voltage VPASS_READ is applied to the gate will be in an on state, regardless of data stored therein.

When the data assignment as described above is applied, one page data (lower-order page data) of a lower-order bit in a read operation can be confirmed by read results using the read voltages VrA and VrE. One page data (middle-order page data) of a middle-order bit can be confirmed by read results using the read voltages VrB, VrD, and VrF. One page data (higher-order page data) of a higher-order bit can be confirmed by read results using the read voltages VrC and VrG.

1.7 Program Operation of Semiconductor Memory Device

Next, a program operation of the semiconductor memory device 2*a* will be described. In the following, although an example in a case where the target of the program operation is the plane PL1 will be described, a case of the plane PL2 is also similar to the following.

Figure 7:
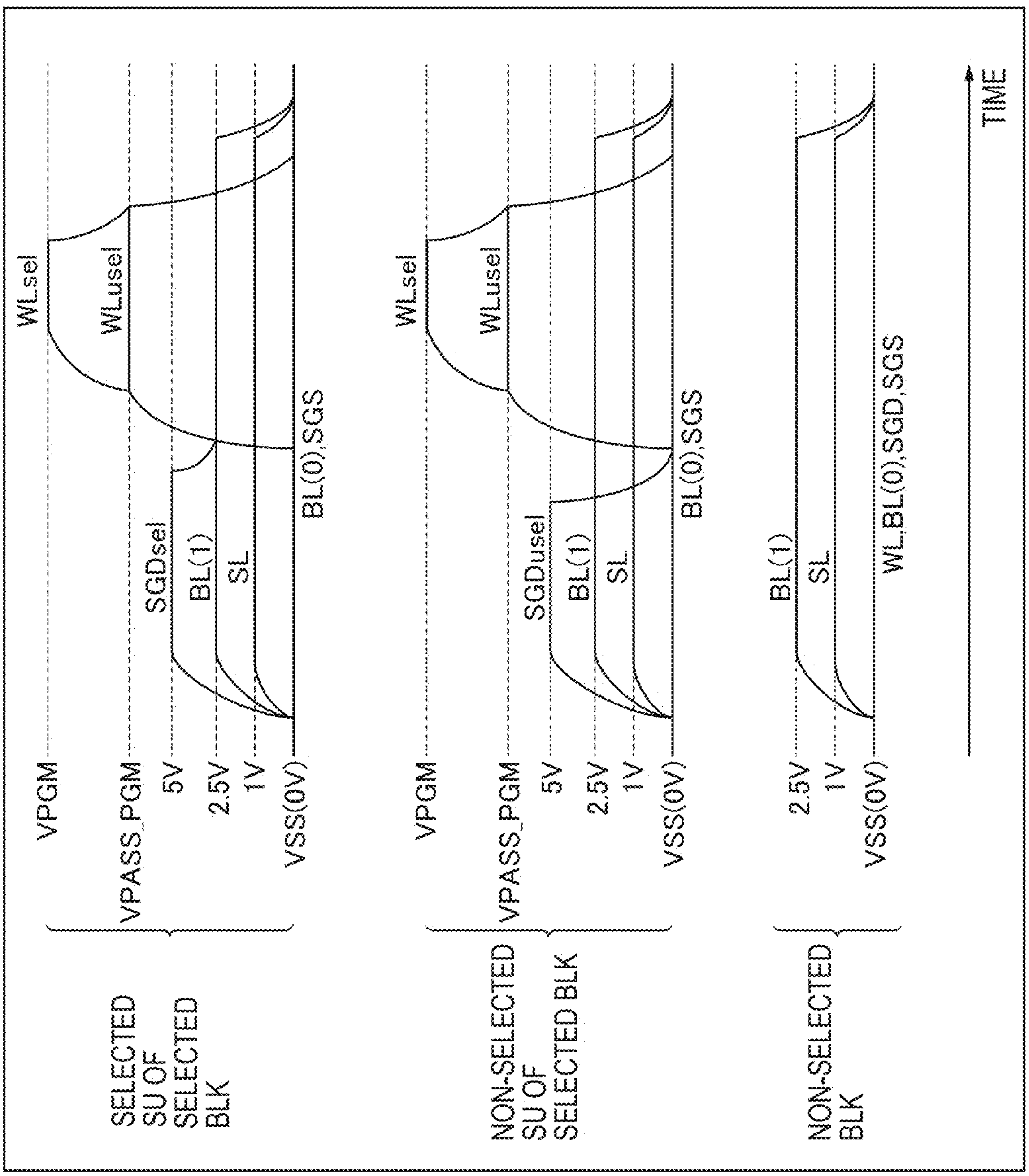
FIG. 7 is a diagram illustrating the voltage change of various wires at the time of a program operation.

FIG. 7 illustrates the voltage change of various wirings at the time of a program operation. In the program operation, the sense amplifier 120 changes the voltage of each bit line BL corresponding to program data. For example, the ground voltage VSS (0V) is applied, as an “L” level, to the bit line BL connected to the memory cell transistor MT to be programmed (whose threshold value voltage is to be raised). For example, 2.5V is applied, as an “H” level, to the bit line BL connected to the memory cell transistor MT not to be programmed (whose threshold value voltage is to be maintained). The former bit line BL is indicated by “BL (0)” in FIG. 7. The latter bit line BL is indicated by “BL (1)” in FIG. 7.

The row decoder 130 selects one of the blocks BLK as the target of a write operation, and further selects one of the string units SU. More specifically, for example, 5V is applied to the select gate line SGD (selected select gate line SGDsel) in the selected string unit SU from the voltage generation circuit 43 via the row decoder 130. Accordingly, the selection transistor ST1 will be in an on state. On the other hand, for example, the voltage VSS is applied to the select gate line SGS from the voltage generation circuit 43 via the row decoder 130. Accordingly, the selection transistor ST2 will be in an off state.

Additionally, for example, a voltage of 5V is applied to the select gate lines SGD (non-selected select gate lines SGDusel) of the non-selected string units SU in the selected block BLK from the voltage generation circuit 43 via the row decoder 130. Accordingly, the selection transistors ST1 will be in the on state. Note that, in the string units SU included in each block BLK, the select gate line SGS is commonly connected. Accordingly, also in the non-selected string units SU, the selection transistors ST2 will be in the off state.

Further, for example, the voltage VSS is applied to the select gate lines SGD and the select gate lines SGS in the non-selected blocks BLK via the row decoder 130 from the voltage generation circuit 43. Accordingly, the selection transistors ST1 and the selection transistors ST2 will be in the off state.

The source line SL is set to have a voltage higher than the voltage of the select gate line SGS. The voltage is, for example, 1V.

Thereafter, the voltage of the selected select gate line SGDsel in the selected block BLK is set to, for example, 2.5V. This voltage is a voltage that can turn on the selection transistor ST1 corresponding to the bit line BL (0) to which 0V is given in the above-described example, and that can cut off the selection transistor ST1 corresponding to the bit line BL (1) to which 2.5V is given. Accordingly, in the selected string unit SU, the selection transistor ST1 corresponding to the bit line BL (0) is turned on, and the selection transistor ST1 corresponding to the bit line BL (1) to which 2.5V is given is cut off. On the other hand, the voltage of the non-selected select gate line SGDusel is set to, for example, the voltage VSS. Accordingly, in the non-selected string units SU, the selection transistors ST1 are cut off, regardless of the voltages of the bit line BL (0) and the bit line BL (1).

Then, the row decoder 130 selects one of the word lines WL as the target of a write operation in the selected block BLK. For example, a voltage VPGM is applied to the word line WL (selected word line WLsel) that is the target of the write operation, from the voltage generation circuit 43 via the row decoder 130. On the other hand, for example, a voltage VPASS_PGM is applied to the other word lines WL (non-selected word lines WLusel) from the voltage generation circuit 43 via the row decoder 130. The voltage VPGM is a high voltage for injecting electrons into the electric charge accumulation layer 336 by the tunnel phenomenon. The voltage VPASS_PGM is a voltage that turns ON the memory cell transistor MT connected to the word line WL, but that does not change the threshold voltage thereof. The voltage VPGM is voltage higher than VPASS_PGM.

In the NAND string NS corresponding to the bit line BL (0) to be programmed, the selection transistor ST1 will be in the on state. Therefore, the channel voltage of the memory cell transistor MT connected to the selected word line WLsel becomes 0V. Since the voltage difference between a control gate and a channel increases, and as a result, electrons are injected into the electric charge accumulation layer 336, the threshold value voltage of the memory cell transistor MT is raised.

In the NAND string NS corresponding to the bit line BL (1) that is not to be programmed, the selection transistor ST1 will be in a cutoff state. Therefore, the channel of the memory cell transistor MT connected to selected word line WLsel is electrically floating, and the channel voltage is raised to near the voltage VPGM due to capacitive coupling with the word line WL and the like. Since the voltage difference between the control gate and the channel decreased, and as a result, electrons are not injected into the electric charge accumulation layer 336, the threshold value voltage of the memory cell transistor MT is maintained. To be precise, the threshold voltage does not change enough to cause the threshold value distribution level to transition to a higher distribution.

1.8 Reading Operation of Semiconductor Memory Device

Next, the read operation of the semiconductor memory device 2*a* will be described. In the following, although an example in a case where the target of the read operation is the plane PL1 will be described, a case of the plane PL2 is also similar to the following. The verify operation that follows the program operation is the same as the read operation described in the following.

Figure 8:
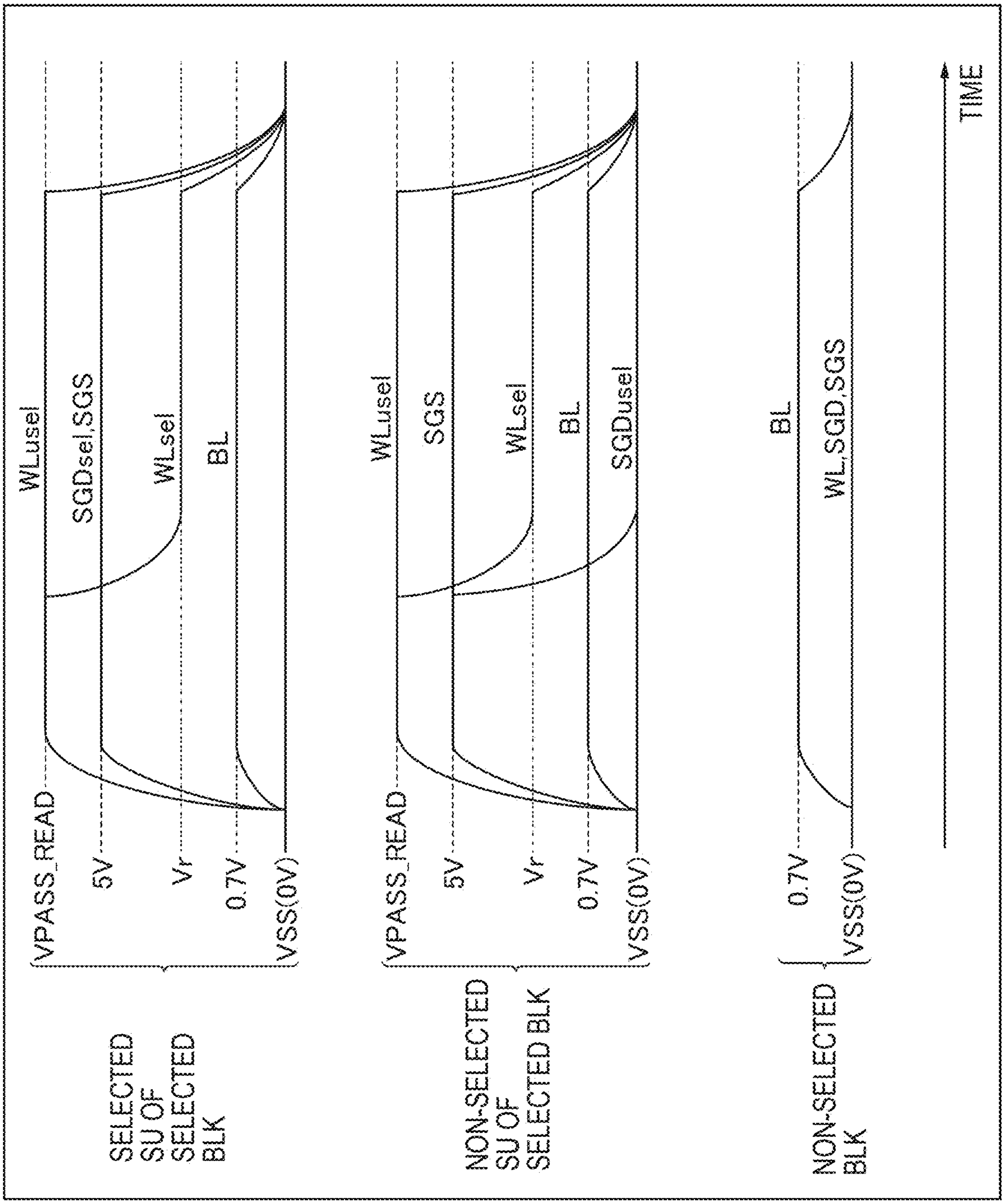
FIG. 8 is a diagram illustrating the voltage change of various wires at the time of a read operation.

FIG. 8 illustrates the voltage change of various wirings at the time of a read operation. In the read operation, the NAND string NS including the memory cell transistor MT that is the target of the read operation is selected. Alternatively, the string unit SU including a page that is the target of the read operation is selected.

First, for example, 5V is applied to the selected select gate line SGDsel, the non-selected select gate line SGDusel, and the select gate line SGS from the voltage generation circuit 43 via the row decoder 130. Accordingly, the selection transistor ST1 and the selection transistor ST2 that are included in the selected block BLK will be in the on state. Additionally, for example, the read path voltage VPASS_READ is applied to the selected word line WLsel and the non-selected word lines WLusel from the voltage generation circuit 43 via the row decoder 130. The read path voltage VPASS_READ is a voltage that can turn on the memory cell transistor MT, regardless of the threshold value voltage of the memory cell transistor MT, and that does not change the threshold value voltage. Accordingly, regardless of whether it is the selected string unit SU or the non-selected string unit SU, current is conducted in all the NAND strings NS included in the selected block BLK.

Next, for example, a read voltage Vr such as VrA is applied to the word line WL (selected word line WLsel) connected to the memory cell transistor MT that is the target of a read operation, from the voltage generation circuit 43 via the row decoder 130. The read path voltage VPASS_READ is applied to the other word lines (non-selected word lines WLusel).

Additionally, while maintaining the voltage applied to the selected select gate line SGDsel and the select gate line SGS, for example, the voltage VSS is applied to the non-selected select gate lines SGDusel from the voltage generation circuit 43 via the row decoder 130. Accordingly, although the selection transistor ST1 included in the selected string unit SU maintains the on state, the selection transistors ST1 included in the non-selected string units SU will be in the off state. Note that, regardless of whether it is the selected string unit SU or the non-selected string unit SU, the selection transistor ST2 included in the selected block BLK will be in the on state.

Accordingly, the NAND string NS included in the non-selected string unit SU does not form a current path, since at least the selection transistor ST1 will be in the off state. On the other hand, the NAND string NS included in the selected string unit SU forms a current path or does not form a current path, according to the relationship between the read voltage Vr applied to the selected word line WLsel and the threshold value voltage of the memory cell transistor MT.

The sense amplifier 120 applies voltage to the bit line BL connected to the selected NAND string NS. In this state, the sense amplifier 120 performs reading of data based on the value of current flowing through the bit line BL. Specifically, it is determined whether or not the threshold value voltage of the memory cell transistor MT that is the target of a read operation is higher than the read voltage applied to the memory cell transistor MT. Note that the reading of data may be performed not based on the value of the current flowing through the bit line BL, but based on time variation of the voltage in the bit line BL. In the latter case, the bit line BL is precharged in advance to be at a predetermined voltage.

The aforementioned verify operation is also performed in a manner similar to the read operation as described above. In the verify operation, for example, a verify voltage such as VfyA will be applied to the word line WL connected to the memory cell transistor MT to be verified, from the voltage generation circuit 43 via the row decoder 130.

Note that the operation of applying a voltage of 5V to the selected select gate line SGDsel and the non-selected select gate lines SGDusel in the initial stage of the aforementioned program operation may be omitted. Similarly, the operation of applying a voltage of 5V to the non-selected select gate lines SGDusel in the initial stage of the aforementioned read operation (verify operation), and applying the read path voltage VPASS_READ to the selected word line WLsel may be omitted.

Figure 9:
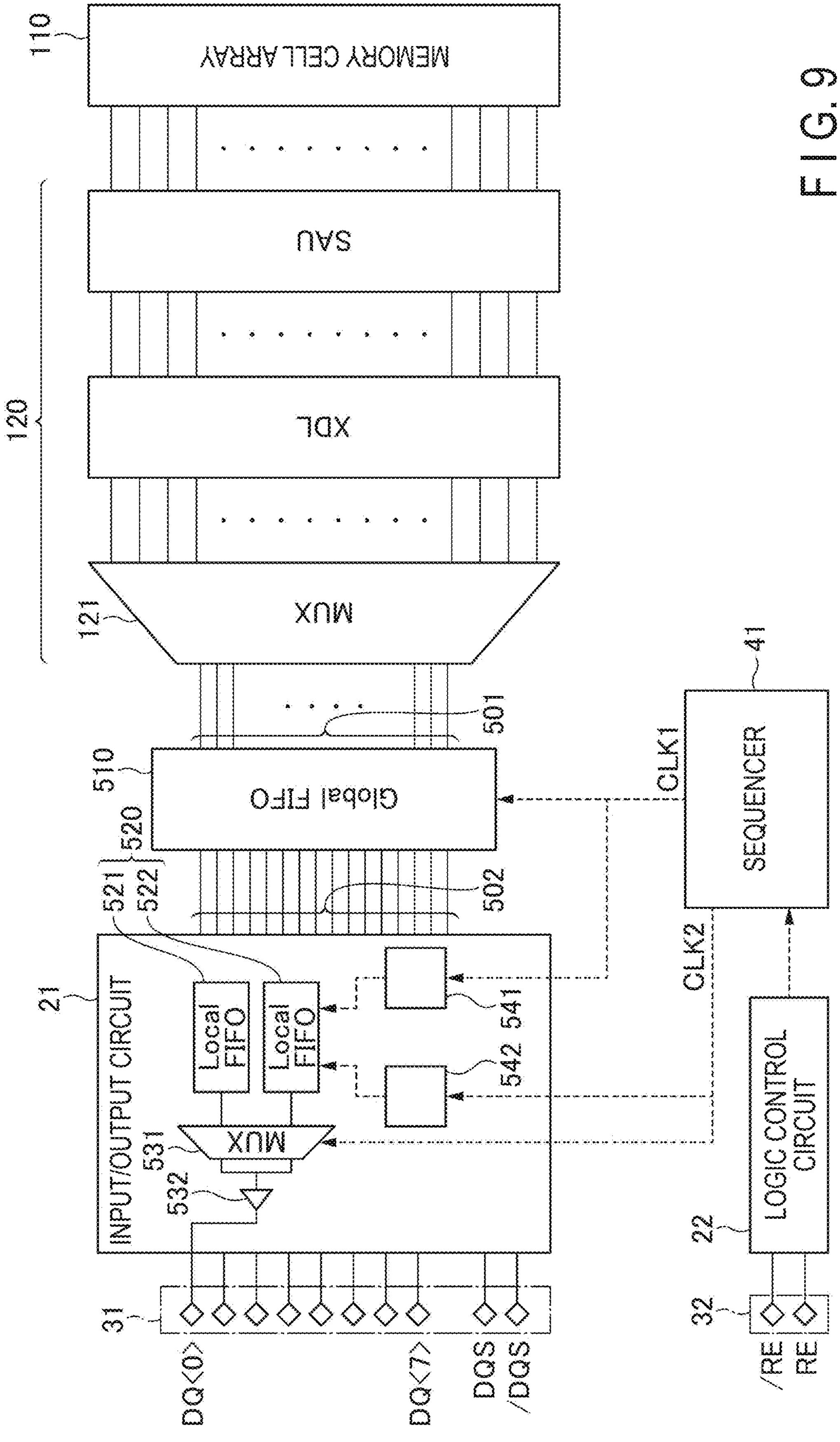
FIG. 9 is a diagram illustrating the configuration of a circuit for outputting data to a memory controller from a memory cell array in the memory system of the embodiment.

1.9 Specific Configuration for Outputting Data from Semiconductor Memory Device Next, a specific configuration for outputting data from the semiconductor memory device 2*a* to the memory controller 1 will be described. FIG. 9 is a diagram schematically illustrating the configuration along the path from the memory cell array 110 to the input/output pad group 31 in the semiconductor memory device 2*a*.

As illustrated in FIG. 9, the sense amplifier unit SAU illustrated in FIG. 5, a plurality of latch circuits XDL, and a multiplexer 121 are included in the sense amplifier 120. Data read from the memory cell array 110 is transmitted from the sense amplifier unit SAU to the latch circuits XDL and is temporarily stored in the latch circuits XDL, and is thereafter transferred to a first storage unit 510 via the multiplexer 121. The multiplexer 121 and the first storage unit 510 are connected by a first data bus 501 that consists of, for example, 128 wires. Note that the number of wires included in the first data bus 501 is not limited to 128. The number of wires included in the first data bus 501 is less than the number of wires connecting the plurality of latch circuits XDL and the multiplexer 121. The multiplexer 121 sequentially transfers each piece of data transmitted from the plurality of latch circuits XDL to the first storage unit 510 via the first data bus 501.

The first storage unit 510 stores a plurality of pieces of data that are read from the memory cell array 110, and is a FIFO circuit configured to perform a so-called "First In First Out (FIFO)" operation. The first storage unit 510 temporarily stores a plurality of pieces of data transferred from the multiplexer 121, and sequentially outputs the plurality of pieces of data to the input/output circuit 21 in a first-in first out manner. The first storage unit 510 and the input/output circuit 21 are connected by a second data bus 502 consisting of, for example, 16 signal wires. Note that the number of wires included in the second data bus 502 is not limited to 16. The data input to the input/output circuit 21 from the first storage unit 510 is temporarily stored by a second storage unit 520, and is thereafter output from the input/output pad group 31 to the outside as the signal DQ<7:0>.

The input/output circuit 21 includes the second storage unit 520, a write pointer generation circuit 541, a read pointer generation circuit 542, a multiplexer 531, and a driver 532. A circuit in which the second storage unit 520, the write pointer generation circuit 541, the read pointer generation circuit 542, the multiplexer 531, and the driver 532 is individually provided corresponding to each of eight pads included in the input/output pad group 31, that is, eight pads corresponding to the signal DQ<7:0>. In other words, in the input/output circuit 21, eight second storage units 520, eight multiplexers 531, and the like are provided. In FIG. 9, only those connected to a pad of DQ<0> among these is illustrated, and illustration of the other portions is omitted.

The second storage unit 520 receives data transmitted from the first storage unit 510, and stores a plurality of kinds of such data. The second storage unit 520 is divided into a portion holding even data, and a portion holding odd data. Hereinafter, the former portion is also referred to as "the second storage unit 521." Hereinafter, the latter portion is also referred to as "the second storage unit 522".

Similar to the first storage unit 510, the second storage unit 520 is a FIFO circuit configured to perform a so-called "first-in first-out (FIFO)" operation. The second storage unit 520 temporarily receives data that is input from the first storage unit 510, and thereafter outputs the data to the pad of DQ<0> in the order in which the data is input. Such output of data is alternately performed by each of the second storage unit 521 and the second storage unit 522 via the multiplexer 531 and the driver 532.

The write pointer generation circuit 541 is a circuit that generates a write pointer Wptr. The write pointer Wptr is a pointer that indicates the storage position (that is, the write position) of data when the data transmitted from the first storage unit 510 is stored in the second storage unit 520.

The read pointer generation circuit 542 is a circuit that generates a read pointer Rptr. The read pointer Rptr is a pointer that indicates the storage position (that is, the read position) of data in the second storage unit 520 when the data is transmitted to the driver 532 from the second storage unit 520.

A pair of circuits consisting of the write pointer generation circuits 541 and the read pointer generation circuits 542 are provided for each of the second storage unit 521 and the second storage unit 522. In FIG. 9, only the write pointer generation circuit 541 and the read pointer generation circuit 542 that are provided for the second storage unit 522 are illustrated, and illustration of the write pointer generation circuit 541 and the read pointer generation circuit 542 that are provided for the second storage unit 521 is omitted.

The transmission of data from the first storage unit 510 to the second storage unit 520 and the transmission of data from the second storage unit 520 to the multiplexer 531 are controlled by the sequencer 41.

Specifically, the sequencer 41 transmits a clock signal CLK1 to each of the first storage unit 510 and the write pointer generation circuit 541, thereby controlling the operation of each of the first storage unit 510 and the write pointer generation circuit 541. The clock signal CLK1 is a signal that specifies the timing for the second storage unit 520 to capture data. The write pointer generation circuit 541 generates the write pointer Wptr based on the input clock signal CLK1. The write pointer Wptr is incremented by the write pointer generation circuit 541 at the timing when the clock signal CLK1 rises from the "L" level to the "H" level. When the write pointer Wptr is incremented, the storage position (that is, the write position) of data in the second storage unit 520 at the time when the data captured from the first storage unit 510 is stored in the second storage unit 520 is sequentially changed.

Additionally, the sequencer 41 transmits a clock signal CLK2 to each of the read pointer generation circuit 542 and the multiplexer 531, thereby controlling the operation of each of the read pointer generation circuit 542 and the multiplexer 531. The sequencer 41 generates the clock signal CLK2 based on a read enable signal /RE that is input from the memory controller 1. The read pointer generation circuit 542 generates a read pointer Rptr based on the input clock signal CLK2. The read pointer Rptr is incremented by the read pointer generation circuit 542 at the timing when the clock signal CLK2 rises from the "L" level to the "H" level. When the read pointer Rptr is incremented, the storage position (that is, the read position) of data in the second storage unit 520 at the time of transmitting the data from the second storage unit 520 to the driver 532 is sequentially changed. Accordingly, the "first-in first-out" operation by the second storage unit 520 is realized.

The multiplexer 531 alternately receives the even data input from the second storage unit 521, and the odd data input from the second storage unit 522, and outputs them to the driver 532.

Note that, in order to operate at high speed, the first storage unit 510 and the input/output circuit 21 are configured with a transistor having a lower threshold value voltage as compared to a transistor used in, for example, the sense amplifier 120. In the present embodiment, the first storage unit 510 and the input/output circuit 21 are examples of a data transfer circuit provided between the latch circuits XDL and the input/output pad group 31.

Figure 10:
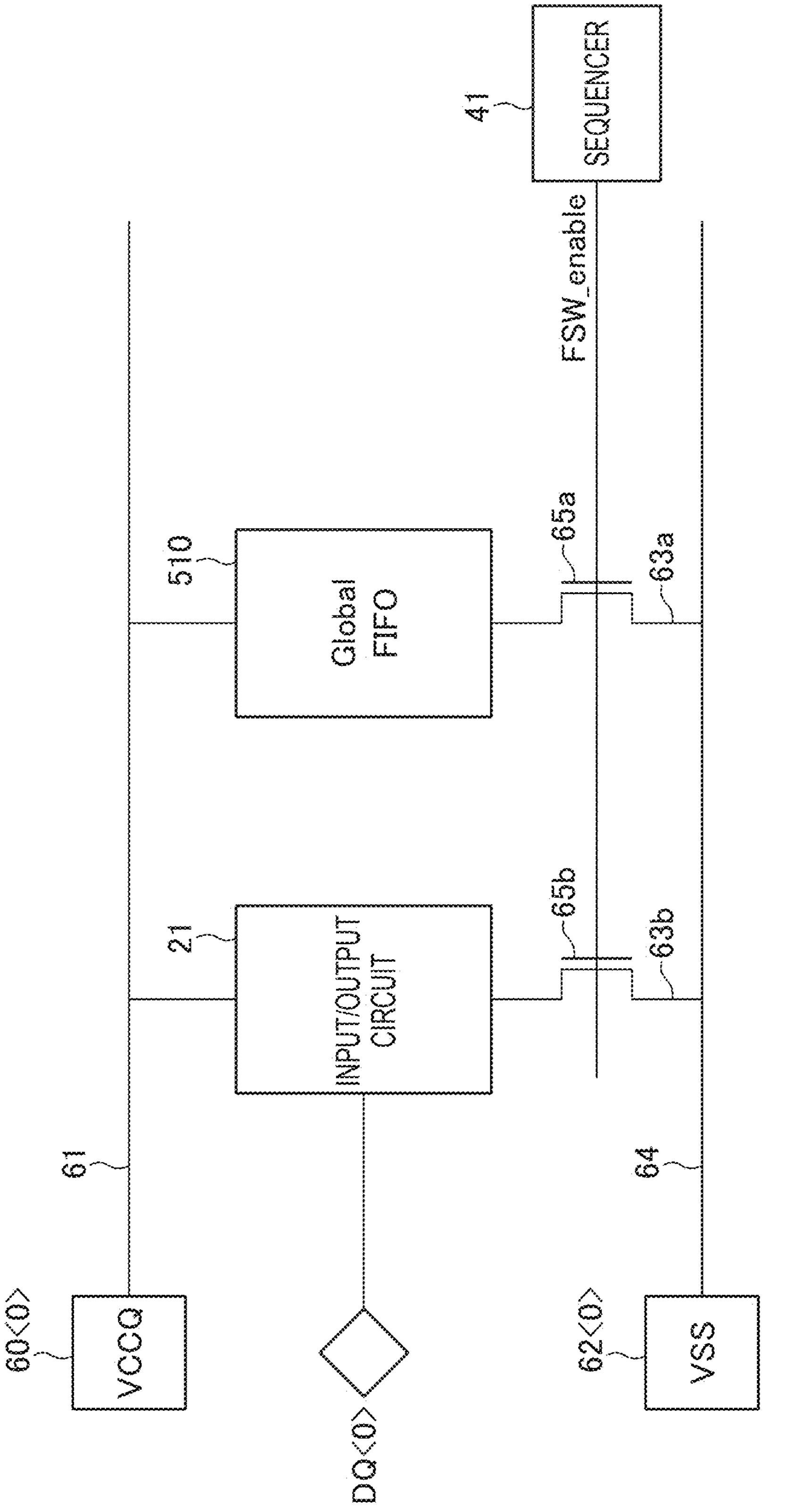
FIG. 10 is a block diagram illustrating a configuration for supplying current to a storage unit and an input/output circuit of the embodiment.

FIG. 10 is a block diagram illustrating a configuration for supplying current to the first storage unit 510 and the input/output circuit 21. Note that, in FIG. 10, only those corresponding to the pad of DQ<0> are illustrated, and illustration is of the other portions is omitted.

As illustrated in FIG. 10, the respective power supply voltage input terminals of the first storage unit 510 and the input/output circuit 21 are connected to a VCCQ pad 60<0> via a wire 61. The VCCQ pad 60<0> is included in the power supply input terminal group 33 illustrated in FIG. 2. The VCCQ pad 60<0> functions as a first power supply voltage input terminal. The VCCQ pad 60<0> supplies the power supply voltage VCCQ to the first storage unit 510 and the input/output circuit 21 via the wire 61.

A ground voltage input terminal of the first storage unit 510 is connected to a VSS pad 62<0> via a wire 63*a* and a wire 64. The ground voltage input terminal of the input/output circuit 21 is connected to the VSS pad 62<0> via a wire 63*b* and the wire 64. The VSS pad 62<0> functions as a second power supply voltage input terminal. The VSS pad 62<0> is included in the power supply input terminal group 33 illustrated in FIG. 2. The VSS pad 62<0> applies the ground voltage VSS to the first storage unit 510 and the input/output circuit 21 via the wires 63*a* and 63*b*, respectively, and the wire 64.

Transistors 65*a* and 65*b* that function as foot switches are provided for the wires 63*a* and 63*b*, respectively. When each of the transistors 65*a* and 65*b* is in an on state, current is supplied to the first storage unit 510 and the input/output circuit 21, and the first storage unit 510 and the input/output circuit 21 becomes operable. When each of the transistors 65*a* and 65*b* is turned into an off state, the supply of current to the first storage unit 510 and the input/output circuit 21 is stopped. Accordingly, it becomes possible to reduce the standby current of, for example, the first storage unit 510 and the input/output circuit 21. The transistors 65*a* and 65*b* are controlled by a control signal FSW_enable transmitted from the sequencer 41. The transistors 65*a* and 65*b* are provided between the ground voltage input terminals of the first storage unit 510 and the input/output circuit 21, respectively, and the wire 64 connected to the VSS pad 62<0>, and control the connection and disconnection between the first storage unit 510 and the input/output circuit 21, and the VSS pad 62<0>. In the present embodiment, the transistors 65*a* and 65*b* are examples of a cutoff unit and a switching element capable of cutting off the supply of current to the first storage unit 510 and the input/output circuit 21. The transistors 65*a* and 65*b* as the cutoff unit and the switching element may be provided between the power supply voltage input terminals of the first storage unit 510 and the input/output circuit 21, and the wire 61 connected to the VCCQ pad 60<0>. In this case, the transistors 65*a* and 65*b* function as head switches, and control the connection or disconnection between the first storage unit 510 and the input/output circuit 21, respectively, and the VCCQ pad 60<0>.

1.10 Reading Operation of Semiconductor Memory Device

Next, specific signal transmission and reception performed between the semiconductor memory device 2*a* and the memory controller 1 at the time of a read operation will be described. In the following, although an example in a case where the target of the read operation is the plane PL1 will be described, a case of the plane PL2 is also similar to the following.

Figure 11:
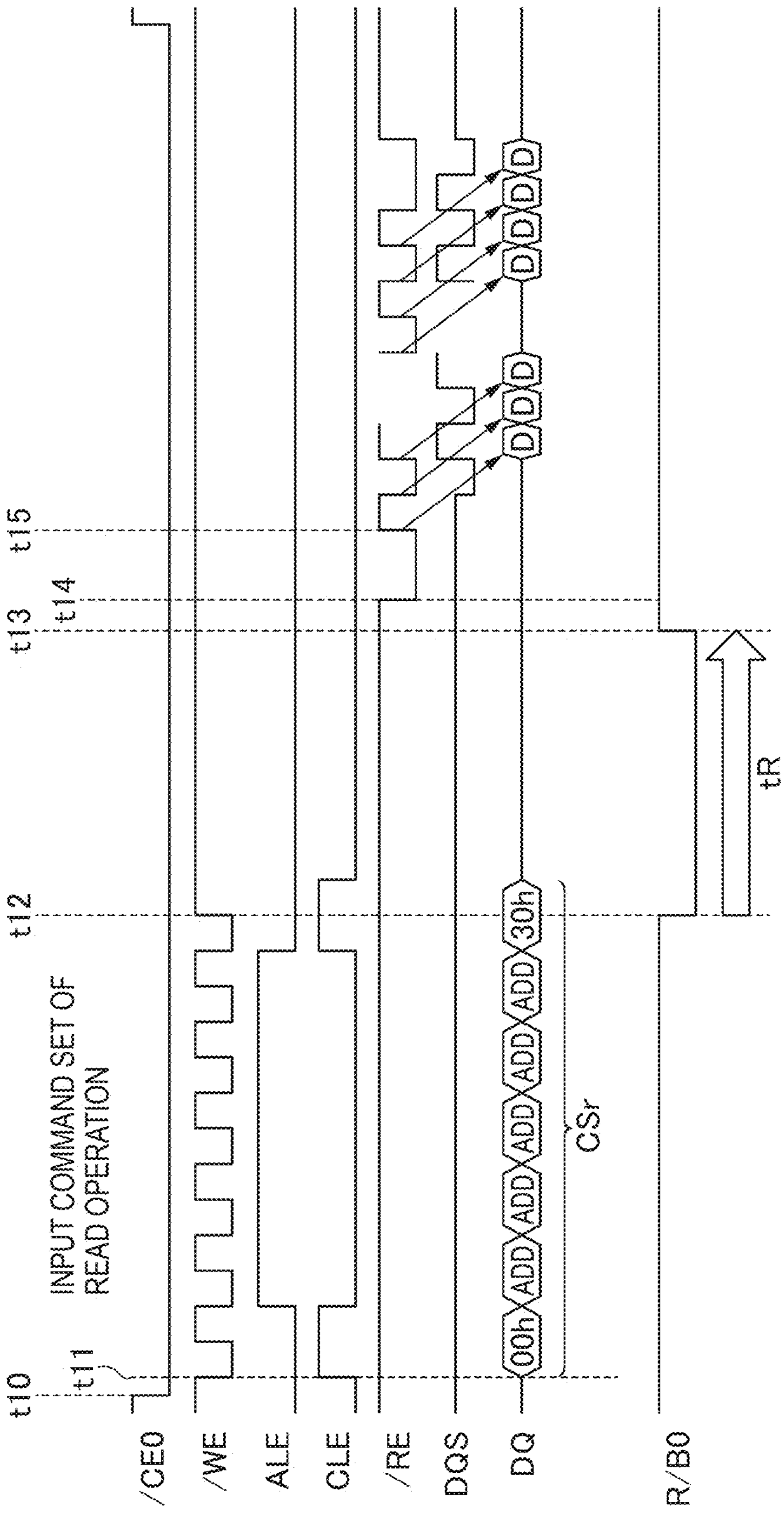
FIG. 11 is a diagram illustrating an example of transition of signals that are transmitted and received between the semiconductor memory device and the memory controller of the embodiment.

As illustrated in FIG. 11, at the time of a read operation, first, at time t10, when the memory controller 1 switches a chip enable signal /CE0 corresponding to the semiconductor memory device 2*a* from the "H" level to the "L" level, the semiconductor memory device 2*a* transitions to an enabled state. Accordingly, the semiconductor memory device 2*a* will be in a state where a signal from the memory controller 1 can be received. Note that, at this time, the sequencer 41 switches the transistors 65*a* and 65*b* illustrated in FIG. 10 to the on state from the off state, thereby supplying current to the first storage unit 510 and the input/output circuit 21, and drives the first storage unit 510 and the input/output circuit 21, respectively.

Subsequently, the memory controller 1 sequentially inputs, to the semiconductor memory device 2*a*, a signal consisting of "00h", a plurality of "ADD", and "30h" as the signal DQ<7:0>. "00h" is a command for performing a read operation on the memory cell array 110. "ADD" is a signal specifying the address from which data is to be read. "30h" is a command for starting the read operation. In FIG. 10, the time at which the memory controller 1 starts inputting the signal DQ<7:0> to the semiconductor memory device 2*a* is indicated by t11. Hereinafter, the signal consisting of "00h", the plurality of "ADD", and "30h" is also referred to as "the command set CSr of read operation".

The memory controller 1 starts toggling of the write enable signal /WE after the time t11. As described above, the write enable signal /WE is the signal for the semiconductor memory device 2*a* to capture the DQ<7:0> signal received from the memory controller 1. The write enable signal /WE is alternately switched (toggled) between the "H" level and the "L" level. The write enable signal /WE switched in this manner is used as a "capturing signal" for capturing data.

When inputting "00h" and "30h" included in the signal DQ<7:0>, the memory controller 1 switches the command latch enable signal CLE from the "L" level to the "H" level, thereby capturing the “00h” and “30h” into the semiconductor memory device 2*a* as commands. Additionally, when inputting the plurality of “ADD” included in the signal DQ<7:0>, the memory controller 1 switches the address latch enable signal ALE from the “L” level to the “H” level”, thereby capturing the plurality of “ADD” into the semiconductor memory device 2*a* as address information from which data is read. The address information captured by the semiconductor memory device 2*a* is stored in the register 42. The address information includes a block address and a row address.

In FIG. 10, the time at which “30h” is captured into the semiconductor memory device 2*a* is indicated by t12. An internal operation is started in the semiconductor memory device 2*a* after the time t12. Specifically, the sequencer 41 operates the row decoder 130 based on the address information from which data stored in the register 42 is read. The row decoder 130 receives the address information from the register 42, selects a block of the memory cell array 110 based on the block address included in the address information, and selects the word line WL based on the row address included in the address information. Then, the row decoder 130 switches the open/close state of the switch group so that the voltage from the voltage generation circuit 43 is applied to the selected word line WL. Accordingly, the preparation for reading data from the memory cell array 110 is completed. Subsequently, the sense amplifier 120 determines the data read stored in the memory cell transistor MT of the memory cell array 110, and temporarily stores the data in the latch circuits XDL. Additionally, the read data temporarily stored in the latch circuits XDL is transferred to the first storage unit 510 and the input/output circuit 21. With the above, the preparation for outputting data from the semiconductor memory device 2*a* to the memory controller 1 is completed. In FIG. 11, the time period secured for such internal operation of the semiconductor memory device 2*a* is indicated by tR. That is, at the time t13 at which the predetermined time period tR has elapsed since the time t12, the preparation for outputting data to the memory controller 1 from the semiconductor memory device 2*a* is completed. The predetermined time period tR is, for example, 50 μsec to 100 μsec.

At time t14 at which a predetermined time period has elapsed since the time t13, the memory controller 1 starts toggling of the read enable signal/RE. As described above, the read enable signal/RE is the signal for the memory controller 1 to instruct the output of data from the semiconductor memory device 2*a* to the memory controller 1, and is input to the input/output pad group 31 of the semiconductor memory device 2*a*. After the time t13, the read enable signal/RE is alternately switched (toggled) between the “H” level and the “L” level. The read enable signal/RE switched in this manner is used as a “read control signal” for instructing the output of data.

Every time the read enable signal /RE is switched (that is, every time each read control signal is input), the semiconductor memory device 2*a* outputs data as the signal DQ<7:0> from the input/output pad group 31, and switches the data strobe signal DQS between the “H” level and the “L” level. In FIG. 11, each piece of data that is output as the signal DQ<7:0> is indicated by “D”. Additionally, the timing at which the read enable signal /RE is first switched to a high level is indicated by time t15. In FIG. 11, the corresponding relationship between the switching of the read enable signal /RE input from the memory controller 1 and the switching of the data strobe signal DQS output from the semiconductor memory device 2*a* is indicated by arrows.

Note that the output of the read data from the semiconductor memory device 2*a* is performed by dividing one piece of data into even data consisting of even bits and odd data consisting of odd bits, and thereafter alternately outputting the even data and the odd data. Each data indicated by “D” in FIG. 11 is output as either the even data or the odd data.

Figure 12:
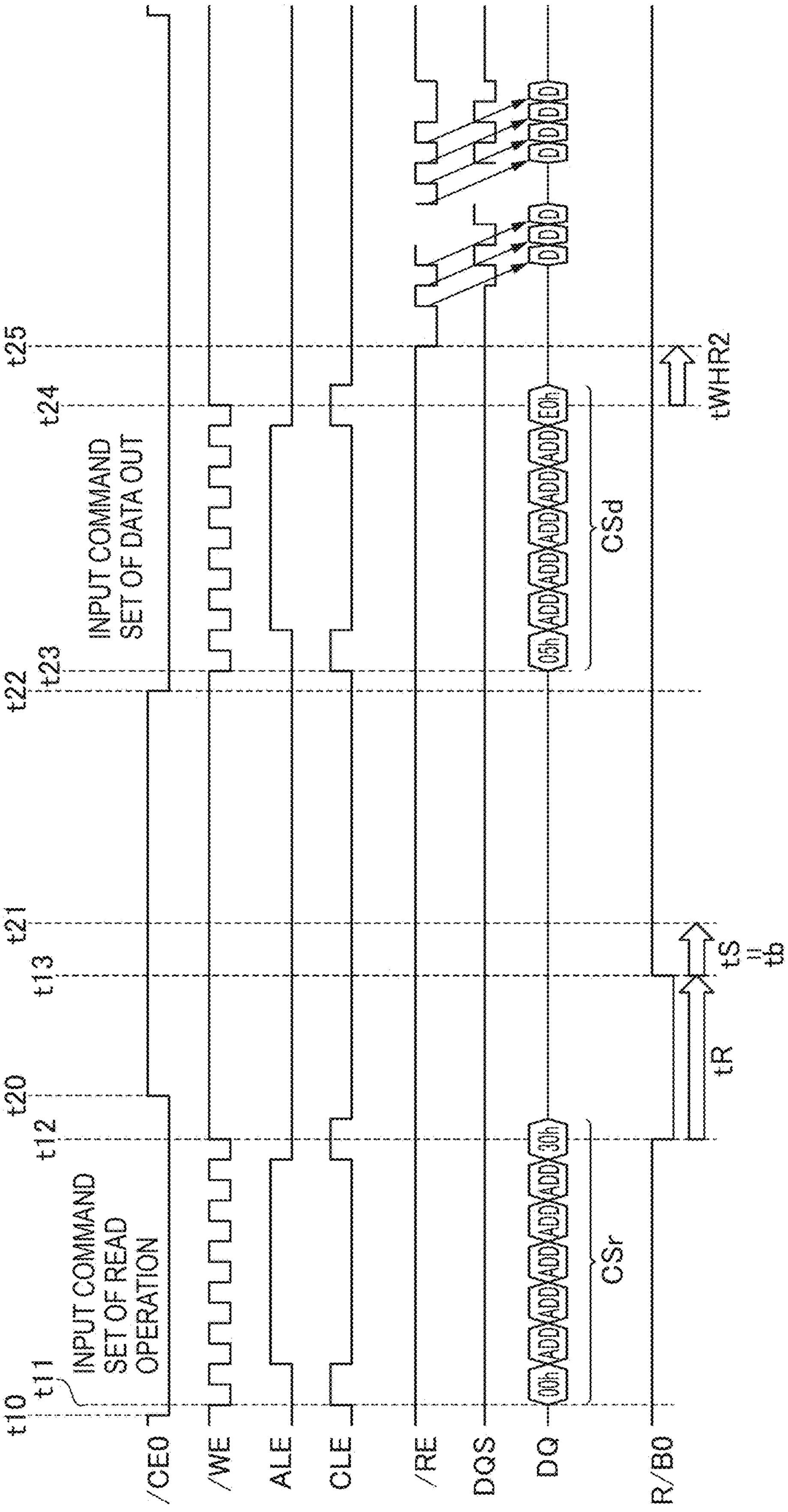
FIG. 12 is a diagram illustrating an example of transition of signals that are transmitted and received between the semiconductor memory device and the memory controller of the embodiment.

Incidentally, as illustrated in FIG. 1, when the plurality of semiconductor memory devices 2*a* to 2*d* exist in the memory system 3, after the memory controller 1 instructs, for example, the predetermined semiconductor memory device 2*a* to perform a read operation of data, and before obtaining the data from the predetermined semiconductor memory device 2*a*, the memory controller 1 may instruct another semiconductor memory device 2*b* to perform various operations such as a read operation of data in an interrupting manner. For example, when signals are transmitted and received between the memory controller 1 and the semiconductor memory device 2*a* as illustrated in FIG. 11, although the instruction for the read operation of data to the semiconductor memory device 2*a* is completed at the time t12, the memory controller 1 needs to stand by until the internal operation of the semiconductor memory device 2*a* is completed in the period from the time t12 to the time t13. During this period, when the memory controller 1 instructs another semiconductor memory device 2*b* to perform a predetermined operation, as illustrated in FIG. 12, the memory controller 1 switches the chip enable signal /CE0 from the “L” level to the “H” level at predetermined time t20 after the time t12. Additionally, the memory controller 1 switches the chip enable signal /CE1 of another semiconductor memory device 2*b* from the “H” level to the “L” level to change the semiconductor memory device 2*b* into an enabled state, thereby instructing the semiconductor memory device 2*b* to perform the predetermined operation.

In the case as illustrated in FIG. 12, when current continues to flow in the first storage unit 510 and the input/output circuit 21 after the time t13 until the output of data from the semiconductor memory device 2*a* to the memory controller 1 is started, the standby current increases. Particularly, since the transistors having low threshold value voltages are used in the first storage unit 510 and the input/output circuit 21 in order to accelerate their operations, there is a concern that the standby current easily becomes large.

Therefore, after the internal operation of the semiconductor memory device 2*a* is completed at the time t13, when the read enable signal /RE is not switched (the read control signal is not input) until the time t21 at which a predetermined time period tS has elapsed since the time t13, and the chip enable signal /CE0 is not at the “L” level, that is, the semiconductor memory device 2*a* is not in the enabled state, the sequencer 41 in the present embodiment switches the transistors 65*a* and 65*b* illustrated in FIG. 10 to the off state using the control signal FSW_enable. Accordingly, since the supply of current to the first storage unit 510 and the input/output circuit 21 is stopped at the time t21, the standby current of the first storage unit 510 and the input/output circuit 21 is reduced after the time t21. Note that, hereinafter, the predetermined time period tS is referred to as “the standby time period tS”. After the time t21, the semiconductor memory device 2*a* will be in a state of waiting for the output of data to the memory controller 1. It is possible to consider that “the standby time period tS” is a time period for maintaining a standby state for outputting data to the memory controller 1, after the read data temporarily stored by the latch circuits XDL is transferred to the first storage unit 510 and the input/output circuit 21 in the semiconductor memory device 2*a*. After the data is transferred to the first storage unit 510 and the input/output circuit 21, when the read enable signal /RE is switched (the read control signal is input) during "the standby time period tS", the semiconductor memory device 2*a* in the present embodiment performs the output of the data to the memory controller 1 using the first storage unit 510 and the input/output circuit 21, and when the read enable signal /RE is not switched (the read control signal is not input) until "the standby time period tS" ends, the semiconductor memory device 2*a* in the present embodiment stops the supply of current to the first storage unit 510 and the input/output circuit 21. Additionally, the output of the data from the semiconductor memory device 2*a* to the memory controller 1 may be instructed by a method other than switching of the read enable signal /RE and RE (inputting of the read control signal). In this case, after the data is transferred to the first storage unit 510 and the input/output circuit 21, when the output of the data is not performed until "the standby time period tS" ends, the semiconductor memory device 2*a* in the present embodiment stops the supply of current to the first storage unit 510 and the input/output circuit 21.

When the supply of current to the first storage unit 510 and the input/output circuit 21 is stopped at the time t21 (when the data output standby state is no longer maintained), the data transferred to the first storage unit 510 and the input/output circuit 21 from the sense amplifier 120 is erased. Therefore, after that, when causing the semiconductor memory device 2*a* to output data to the memory controller 1, the memory controller 1 needs to input a command of a data out operation to the semiconductor memory device 2*a*.

Specifically, as illustrated in FIG. 12, when the memory controller 1 causes the semiconductor memory device 2*a* to output data at the time t22 after the time t21, first, the memory controller 1 switches the chip enable signal /CE0 from the "H" level to the "L" level. Accordingly, the semiconductor memory device 2*a* will be in the enabled state. At this time, the sequencer 41 switches the transistors 65*a* and 65*b* illustrated in FIG. 10 from the off state to the on state using the control signal FSW_enable, thereby supplying current to the first storage unit 510 and the input/output circuit 21, and drives each of the first storage unit 510 and the input/output circuit 21.

Subsequently, the memory controller 1 sequentially inputs a signal consisting of "05h", a plurality of "ADD", and "E0h" as the signal DQ<7:0> to the semiconductor memory device 2*a*. "05h" is a command for causing the memory cell array 110 to perform the data out operation. "ADD" is a signal that specifies the address from which data is to be read. "E0h" is a command for starting a read operation. In FIG. 12, the time at which the memory controller 1 starts the input of the signal DQ<7:0> to the semiconductor memory device 2*a* is indicated by t23. Hereinafter, the signal consisting of "05h", a plurality of "ADD", and "E0h" is also referred to as "the command set CSd of data out operation."

The memory controller 1 starts toggling of the write enable signal /WE after the time t23. Additionally, when inputting the command set CSd of data out operation as the signal DQ<7:0>, the memory controller 1 switches the command latch enable signal CLE and the address latch enable signal ALE between the "H" level and the "L" level as illustrated in FIG. 12, thereby capturing "05h" and "E0h" into the semiconductor memory device 2*a* as commands, and capturing the plurality of "ADD" into the semiconductor memory device 2*a* as the address information from which data is read. The address information captured into the semiconductor memory device 2*a* is stored in the register 42.

In FIG. 12, the time at which "E0h" is captured into the semiconductor memory device 2*a* is indicated by t24. After time t25, i.e., when a predetermined time period tWHR2 has elapsed since the time t24, the memory controller 1 starts toggling of the read enable signal /RE. The predetermined time period tWHR2 is a time period secured for the preparation in which the read data temporarily stored in the latch circuits XDL is transferred to the first storage unit 510 and the input/output circuit 21, and the output of data from the semiconductor memory device 2*a* to the memory controller 1 is enabled. After the time t25, the memory controller 1 switches each of the read enable signal /RE and the data strobe signal DQS between the "H" level and the "L" level as illustrated in FIG. 12. Accordingly, the semiconductor memory device 2*a* outputs the data to the memory controller 1 as the signal DQ<7:0>.

In this manner, when the supply of current to the first storage unit 510 and the input/output circuit 21 is stopped at the time t21, it is necessary for the semiconductor memory device 2*a* in the present embodiment to input the command set CSd of data out operation to the semiconductor memory device 2*a* again as the signal DQ<7:0>. During this time period in which the command set CSd of data out operation is input to the semiconductor memory device 2*a* from the memory controller 1, it is impossible for each of the other semiconductor memory devices 2*b* to 2*d* to perform another operation such as input/output operations of data. This is a factor that worsens the usage efficiency of the bus of the semiconductor memory device 2*a*.

On the other hand, when the supply of current to the first storage unit 510 and the input/output circuit 21 is stopped at the time t21, i.e., after the standby time period tS has elapsed since the time t13 illustrated in FIG. 12, it is impossible to continue storing read data in the first storage unit 510 and the input/output circuit 21. In this case, it is impossible to output the data from the semiconductor memory device 2*a* to the memory controller 1, without inputting the command set CSd of data out operation to the semiconductor memory device 2*a* from the memory controller 1. However, when the supply of current to the first storage unit 510 and the input/output circuit 21 is not stopped, there is concern that standby current increases.

Therefore, in the semiconductor memory device 2*a* of the present embodiment, the standby time period tS illustrated in FIG. 12 can be appropriately changed, so that the timing at which the supply of current to the first storage unit 510 and the input/output circuit 21 is stopped can be changed after the time t13. In other words, the semiconductor memory device 2*a* in the present embodiment is configured such that, after the read data temporarily stored in the latch circuits XDL by the read operation is transferred to the first storage unit 510 and the input/output circuit 21, the standby time period tS in which the data output standby state to the memory controller 1 is maintained can be changed according to an instruction from the memory controller 1. Next, the configuration of the semiconductor memory device 2*a* of this present embodiment will be described.

In the semiconductor memory device 2*a* in the present embodiment, a setting value ta of the standby time period tS is stored in a feature register 41*a* illustrated in FIG. 2. The memory controller 1 can store the setting value ta of the standby time period tS in the feature register 41*a* by inputting the signal DQ<7:0> including a set feature command to the semiconductor memory device 2*a*.

Figure 13:
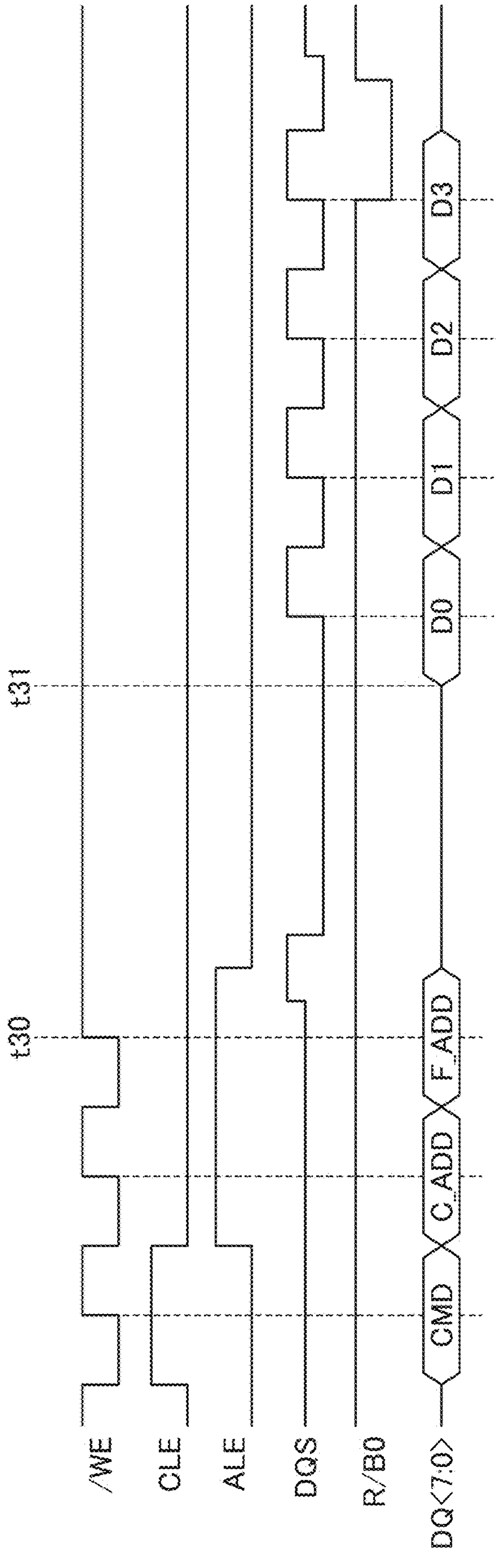
FIG. 13 is a diagram illustrating an example of transition of signals that are transmitted and received between the semiconductor memory device and the memory controller of the embodiment.

Specifically, when storing the setting value ta of the standby time period tS in the feature register 41*a*, the memory controller 1 performs a set feature (SetFeature) operation. That is, the memory controller 1 inputs the signal DQ<7:0> including "CMD", "C_ADD", and "F_ADD" as illustrated in FIG. 13 to the semiconductor memory device 2*a*. "CMD" is a command for instructing the set feature operation to the semiconductor memory device 2*a*. The set feature operation is an operation for storing an operation parameter instructed as feature data in the feature register 41*a*. "C_ADD" is an address (e.g., feature address) of the operation parameter to be set by the set feature operation. In other words, "C_ADD" specifies the location at which the operation parameter instructed as the feature data is to be stored in the feature register 41*a*. "F_ADD" is an address of the feature register 41*a* at which the feature data D0 to D3 is to be stored. The feature data D0 to D3 is the setting value ta of the standby time period tS. For example, data input by a user by operating the host 4 is input as the feature data DO to D3. That is, in the memory system 3 in the present embodiment, the user can set the standby time period tS to any value by operating the host 4.

When inputting the signal DQ<7:0> including "CMD", "C_ADD", and "F_ADD" to the semiconductor memory device 2*a*, the memory controller 1 switches each of the write enable signal /WE, the command latch enable signal CLE, and the address latch enable signal ALE between the "H" level and the "L" level as illustrated in FIG. 13, thereby capturing "CMD" into the semiconductor memory device 2*a* as a command, and capturing "C_ADD" and "F_ADD" into the semiconductor memory device 2*a* as addresses.

In FIG. 13, the time at which "F_ADD" is captured by the semiconductor memory device 2*a* is indicated by t30. After time t31, i.e., when a predetermined time period has elapsed since the time t30, the feature data D0 to D3 is transferred to the semiconductor memory device 2*a* from the memory controller 1 by using the data strobe signals DQS and/DQS. That is, after the time t31, the memory controller 1 inputs the signal DQ<7:0> including the feature data DO to D3 to the semiconductor memory device 2*a*, and switches the data strobe signal DQS between the "H" level and the "L" level. Accordingly, the feature data D0 to D3 is sequentially captured into the semiconductor memory device 2*a* in synchronization with the rising edge of the data strobe signals DQS and /DQS, and is stored in the feature register 41*a*. Accordingly, the setting value ta of the standby time period tS is stored in the feature register 41*a*.

Any time period, such as a time period longer than the predetermined time period tR, a time period longer than the data output period for one page, or the minimum time period in which a command to another semiconductor memory device can be input, can be used as the setting value ta. Hereinafter, a description will be given by taking, as an example, a case where the setting value ta is longer than an initial value tb indicated in FIG. 12, that is, a case where the relationship "ta> tb" is established between the initial value tb and the setting value ta.

When the memory controller 1 instructs a read operation to the semiconductor memory device 2*a*, the memory controller 1 can change the standby time period tS from the initial value tb to the setting value ta by inputting the signal DQ<7:0> including a prefix command.

Figure 14:
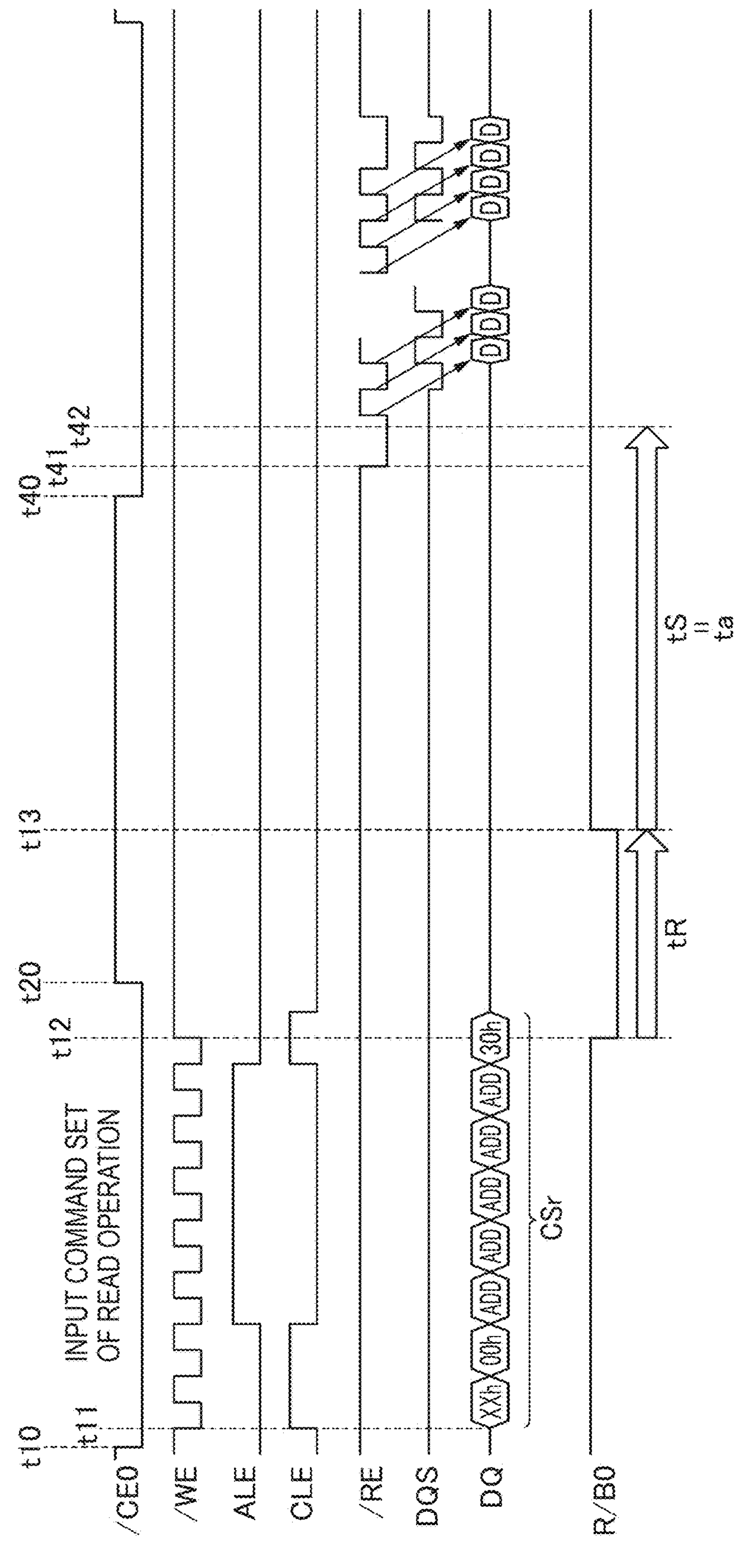
FIG. 14 is a diagram illustrating an example of transition of signals that are transmitted and received between the semiconductor memory device and the memory controller of the embodiment.

For example, as illustrated in FIG. 14, when inputting the command set CSr of read operation as the signal DQ<7:0>, the memory controller 1 adds "xxh" before "00h". "xxh" is the prefix command for instructing that the setting value ta stored in the feature register 41*a* is to be used as the standby time period tS. As shown in FIG. 14, when the signal DQ<7:0> including "xxh" is input to the semiconductor memory device 2*a*, the sequencer 41 of the semiconductor memory device 2*a* uses the setting value ta stored in the feature register 41*a* as the standby time period tS, based on the prefix command xxh. Accordingly, as illustrated in FIG. 14, the standby time period tS is changed from the initial value tb to the setting value ta. Therefore, the sequencer 41 of the semiconductor memory device 2*a* continues operating the first storage unit 510 and the input/output circuit 21, without switching the transistors 65*a* and 65*b* illustrated in FIG. 10 to the off state until the setting value ta elapses since the time t13. Therefore, as illustrated in FIG. 14, when the chip enable signal /CE0 is switched from the "H" level to the "L" level so that the memory controller 1 causes the semiconductor memory device 2*a* to output data at time t40 before the setting value ta elapses since the time t13, the memory controller 1 can immediately read the data from the semiconductor memory device 2*a* as the signal DQ<7:0> after the time t40. Specifically, after time t41, i.e., when a predetermined time period has elapsed since the time t40, the memory controller 1 can switch each of the read enable signal /RE and the data strobe signal DQS between the "H" level and the "L" level, so that data is output as the signal DQ<7:0>. As is clear from the comparison with the operation illustrated in FIG. 12, since the operation of the semiconductor memory device 2*a* illustrated in FIG. 14 does not need to input the command set CSd of data out operation to the semiconductor memory device 2*a*, the usage efficiency of the bus of the semiconductor memory device 2*a* can be improved.

Note that when the setting value ta stored in the feature register 41*a* is not used as the standby time period tS, as illustrated in FIG. 12, the memory controller 1 does not input the prefix command xxh at the time when inputting the command set CSr of read operation to the semiconductor memory device 2*a* as the signal DQ<7:0>. Accordingly, when the prefix command xxh is not included in the command set CSr of read operation, the sequencer 41 of the semiconductor memory device 2*a* sets the standby time period tS to the initial value tb. In this case, as illustrated in FIG. 12, at the time t21, i.e., when the initial value tb has elapsed since the time t13, when the chip enable signal /CE0 remains at the "H" level, the sequencer 41 switches the transistors 65*a* and 65*b* illustrated in FIG. 10 to the off state using the control signal FSW_enable, and stops the supply of current to the first storage unit 510 and the input/output circuit 21. Accordingly, after the time t21, the standby current of the first storage unit 510 and the input/output circuit 21 is reduced.

Additionally, the setting value ta of the standby time period tS can be individually set for each of the semiconductor memory devices 2*a* to 2*d*. Accordingly, the optimum setting value ta of the standby time period tS can be set according to variations and the like in process of each of the semiconductor memory devices 2*a* to 2*d*.

1.11 Operation Example of Semiconductor Memory Device

Next, an operation example of the semiconductor memory device 2*a* of the present embodiment will be described. Note that the operations of the other semiconductor memory devices 2*b* to 2*d* are basically the same.

Figure 15:
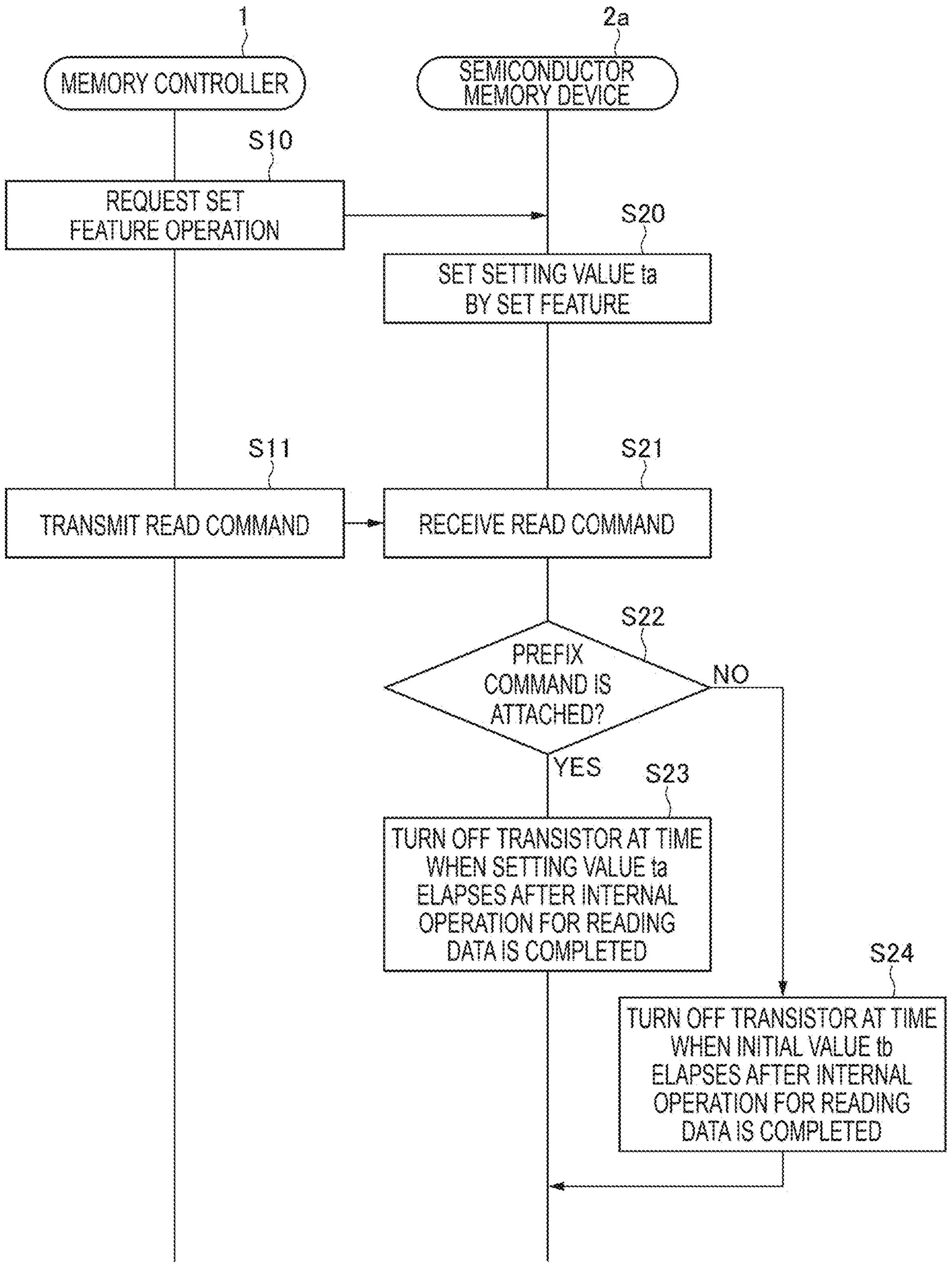
FIG. 15 is a sequence diagram illustrating an operation example of the memory system of the embodiment.

As illustrated in FIG. 15, in the semiconductor memory device 2*a* of the present embodiment, when the memory controller 1 requests the set feature operation to the semiconductor memory device 2*a* as illustrated in FIG. 13 (step S10), the setting value ta of the standby time period tS is set by the set feature in the semiconductor memory device 2*a* (step S20).

Then, as illustrated in FIG. 15, when the memory controller 1 transmits a command for performing a read operation of data to the semiconductor memory device 2*a* (step S11), and the read command is received by the semiconductor memory device 2*a* (step S21), it is determined in the semiconductor memory device 2*a* whether or not the prefix command xxh is attached to the read command (step S22). In the semiconductor memory device 2*a*, when the prefix command xxh is attached to the read command (step S22: YES), at the time when the setting value ta elapses after the internal operation for reading data from the memory cell array 110 is completed, the transistors 65*a* and 65*b* are turned off (step S23).

On the other hand, in the semiconductor memory device 2*a*, when the prefix command xxh is not attached to a read command (step S22: NO), at the time when the initial value tb elapses after the internal operation for reading data from the memory cell array 110 is completed, the transistors 65*a* and 65*b* are turned off (step S24).

1.12 Operations and Effects of Semiconductor Memory Device in Present Embodiment As described above, the semiconductor memory device 2*a* includes the memory cell array 110, latch circuit XDL, the input/output pad group 31, the first storage unit 510, the input/output circuit 21, and the sequencer 41. The latch circuit XDL temporarily stores the data read from the memory cell array 110. The input/output pad group 31 performs transmission and reception of signals to and from the memory controllers 1. The first storage unit 510 and the input/output circuit 21 are provided between the latch circuit XDL and the input/output pad group 31, and transfer the data stored in the latch circuit XDL to the input/output pad group 31. The sequencer 41 controls the first storage unit 510 and the input/output circuit 21. The first storage unit 510 and the input/output circuit 21 are provided with the transistors 65*a* and 65*b* capable of cutting off the supply of current to them. When the standby time period tS elapses without starting data transfer to the memory controller 1 from the time at which data is transferred to the first storage unit 510 and the input/output circuit 21 from the memory cell array 110 via the latch circuit XDL, the sequencer 41 cuts off the supply of current to the first storage unit 510 and the input/output circuit 21 by the transistors 65*a* and 65*b*. The standby time period tS can be changed.

According to this configuration, the standby time tS can be changed according to the operating state of the semiconductor memory device 2*a*. Therefore, in a status where it is assumed that a certain amount of period is required after the memory controller 1 instructs the semiconductor memory device 2*a* to perform a read operation until the memory controller 1 instructs the semiconductor memory device 2*a* to output the read data, the standby time period tS can be set to a long time period. In this case, as illustrated in FIG. 14, even in a case where the read operation of the semiconductor memory device 2*a* is started at the time t10, the read operation is thereafter temporarily interrupted at the time t20, and the semiconductor memory device 2*a* outputs the data to the memory controller 1 at the subsequent time t40, it is possible to switch the read enable signal /RE (input the read control signal to the semiconductor memory device 2*a*) without inputting the command set CSd of data out operation to the semiconductor memory device 2*a*. Therefore, the usage efficiency of the bus of the semiconductor memory device 2*a* can be improved.

The transistors 65*a* and 65*b* are provided to the wires 63*a* and 63*b* that apply the ground voltage to the first storage unit 510 and the input/output circuit 21.

According to this configuration, it is possible to easily cut off the supply of current to the first storage unit 510 and the input/output circuit 21 by turning off the transistors 65*a* and 65*b*.

The semiconductor memory device 2*a* further includes the feature register 41*a* in which the setting value ta of the standby time period tS is stored. The sequencer 41 reads the setting value ta of the standby time period tS from the feature register 41*a*.

According to this configuration, it becomes possible to easily change the standby time period tS from the initial value tb to the setting value ta.

In the semiconductor memory device 2*a*, the setting value ta of the standby time period tS stored in the feature register 41*a* can be updated based on a signal transmitted from the memory controller 1.

According to this configuration, since the setting value ta of the standby time period tS can be set to any value, flexibility is achieved.

Additionally, the sequencer 41 changes the standby time period tS from the initial value tb to the setting value ta, based on the prefix command xxh transmitted from the memory controller 1.

According to this configuration, the memory controller 1 can easily instruct the semiconductor memory device 2*a* to switch the standby time period tS between the initial value tb and the setting value ta. Accordingly, for example, in a status where it is assumed that the memory controller 1 instructs the semiconductor memory device 2*a* to perform a read operation and thereafter immediately instructs the semiconductor memory device 2*a* to output data, the standby time period tS can be left at the initial value tb. Accordingly, for example, in a case where after the semiconductor memory device 2*a* temporarily stores the read data in the latch circuits XDL, the data output is delayed due to another unintended factor, it is possible to avoid that the transistor 65*a* functioning as the foot switch of the input/output circuit 21 and the transistor 65*b* functioning as the foot switch of the first storage unit 510 unintentionally maintain the on state for a long period of time, which increases power consumption.

The setting value ta of the standby time period tS can be set by a user.

According to this configuration, since the user can arbitrarily set the setting value ta of the standby time period tS, flexibility is achieved.

1.13 Modification of Memory System in Embodiment

Next, a modification of the memory system 3 in the embodiment will be described.

Figure 16:
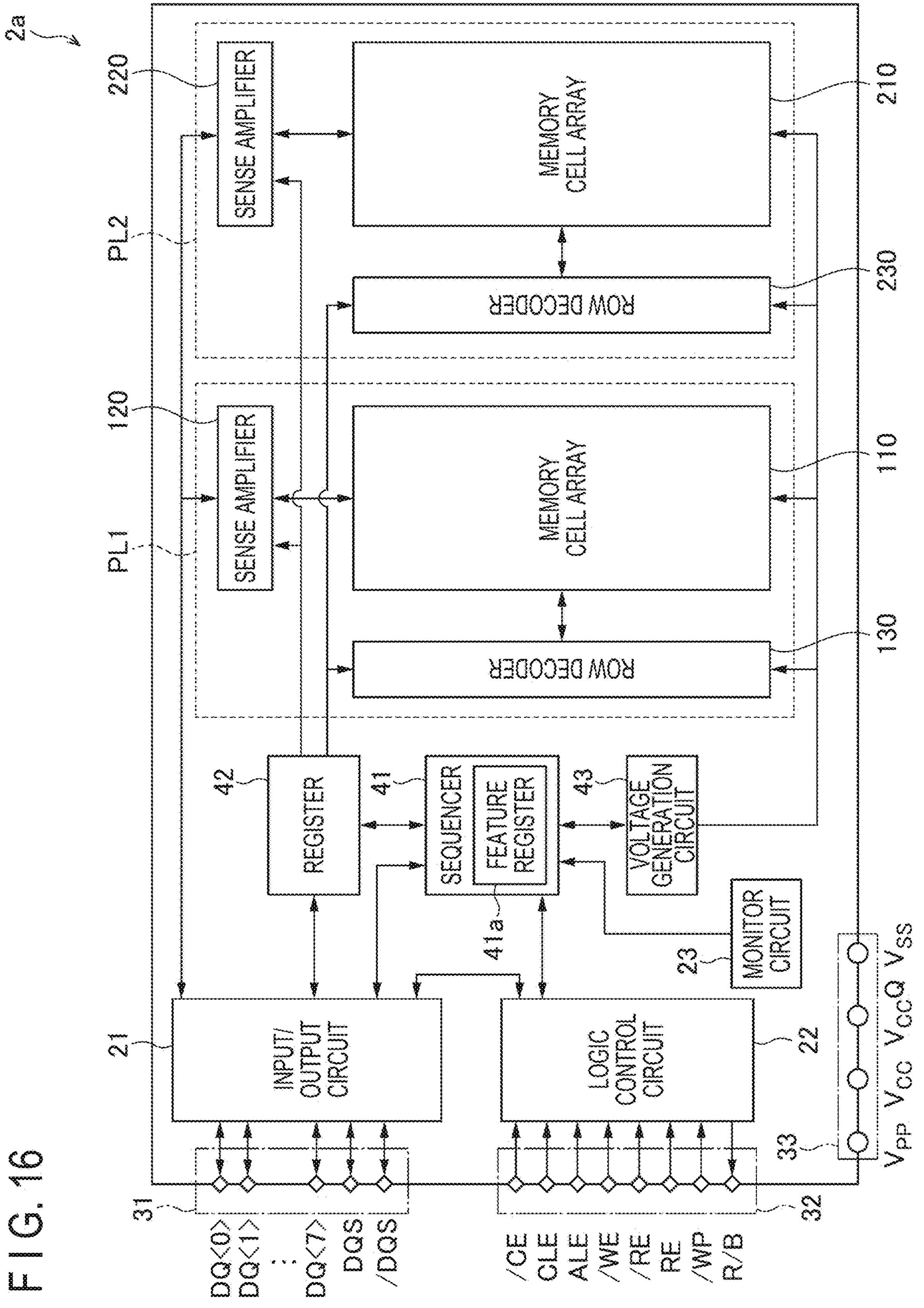
FIG. 16 is a block diagram illustrating a schematic configuration for supplying current to a storage unit and an input/output circuit of a modification of the embodiment.

As illustrated in FIG. 16, the semiconductor memory device 2*a* in the present modification further includes a monitor circuit 23. The monitor circuit 23 monitors the operating state of the semiconductor memory device 2*a*, and obtains the monitor information thereof. The monitor information includes, for example, the information of signals transmitted between the memory controller 1 and the semiconductor memory device 2*a*, the information of the consumption current of the semiconductor memory device 2*a*, the information of the temperature of the semiconductor memory device 2*a*, and the like. The monitor circuit 23 outputs the obtained monitor information to the sequencer 41. In the present modification, the monitor circuit 23 is an example of a monitoring unit.

The sequencer 41 calculates the setting value ta of the standby time period tS based on the monitor information output from the monitor circuit 23. For example, the sequencer 41 calculates, as a recommended value tc, the standby time tS that allows the memory controller 1 to output data without transmitting the command set CSd for data out operation, based on the monitor information. Additionally, the sequencer 41 calculates, as the recommended value tc, the standby time period tS that can optimize the consumption current and temperature of the semiconductor memory device 2*a*, based on the monitor information.

Further, the sequencer 41 outputs the recommended value tc of the standby time period tS to the memory controller 1 based on a request from the memory controller 1. In this case, when the memory controller 1 transmits the recommended value tc of the standby time period tS to the host 4 based on the request from the host 4, the host 4 can output the recommended value tc of the standby time period tS to the user.

According to this configuration, since the user can set the setting value ta with reference to the recommended value tc of the standby time period tS output from the host 4, flexibility is achieved.

Note that the sequencer 41 may cause the feature register 41*a* to store the calculated recommended value tc of the standby time period tS as the setting value ta. According to such a configuration, since it is possible to automatically set the setting value ta of the standby time period tS in the semiconductor memory device 2*a*, it becomes unnecessary to input the setting value ta of the standby time period tS to the semiconductor memory device 2*a* by, for example, the memory controller 1.

2. Other Embodiments

The present disclosure is not limited to the above-described specific examples.

For example, a plurality of setting values ta of the standby time period tS may be stored in the feature register 41*a* of one semiconductor memory device 2*a*. In this case, the memory controller 1 instructs which of the plurality of setting values ta is used as the standby time period tS by the prefix command xxh, and thus it becomes possible to change the standby time period tS according to the operating status of the semiconductor memory device 2*a*. In this manner, the standby time period tS may be selected from the plurality of setting values ta.

The setting value ta of the standby time period tS may be stored in advance in a predetermined register of the sequencer 41. In this case, the sequencer 41 sets the standby time period tS to either the setting value ta or the initial value tb stored in the predetermined register according to, for example, the operating status of the semiconductor memory device 2*a*.

The standby time period tS can also be set to an infinite time period. Accordingly, in the semiconductor memory device 2*a*, it is possible to realize the operation in which, after the data read from, for example, the memory cell array 110 is temporarily stored by the latch circuits XDL, irrespective of when the read enable signal /RE is switched by the memory controller 1 (whether or not there is the read control signal), the supply of current to the first storage unit 510 and the input/output circuit 21 is not cut off. In other words, the data output standby state is not terminated.

The sequencer 41 may determine whether or not a predetermined time period has further elapsed since the time t42, i.e., when the standby time period tS illustrated in FIG. 14 has elapsed, and when the predetermined time period has further elapsed, the sequencer 41 may cut off the supply of current to, for example, the sense amplifier unit SAU. Accordingly, the standby current of the semiconductor memory device 2*a* can be further reduced.

Figure 17:
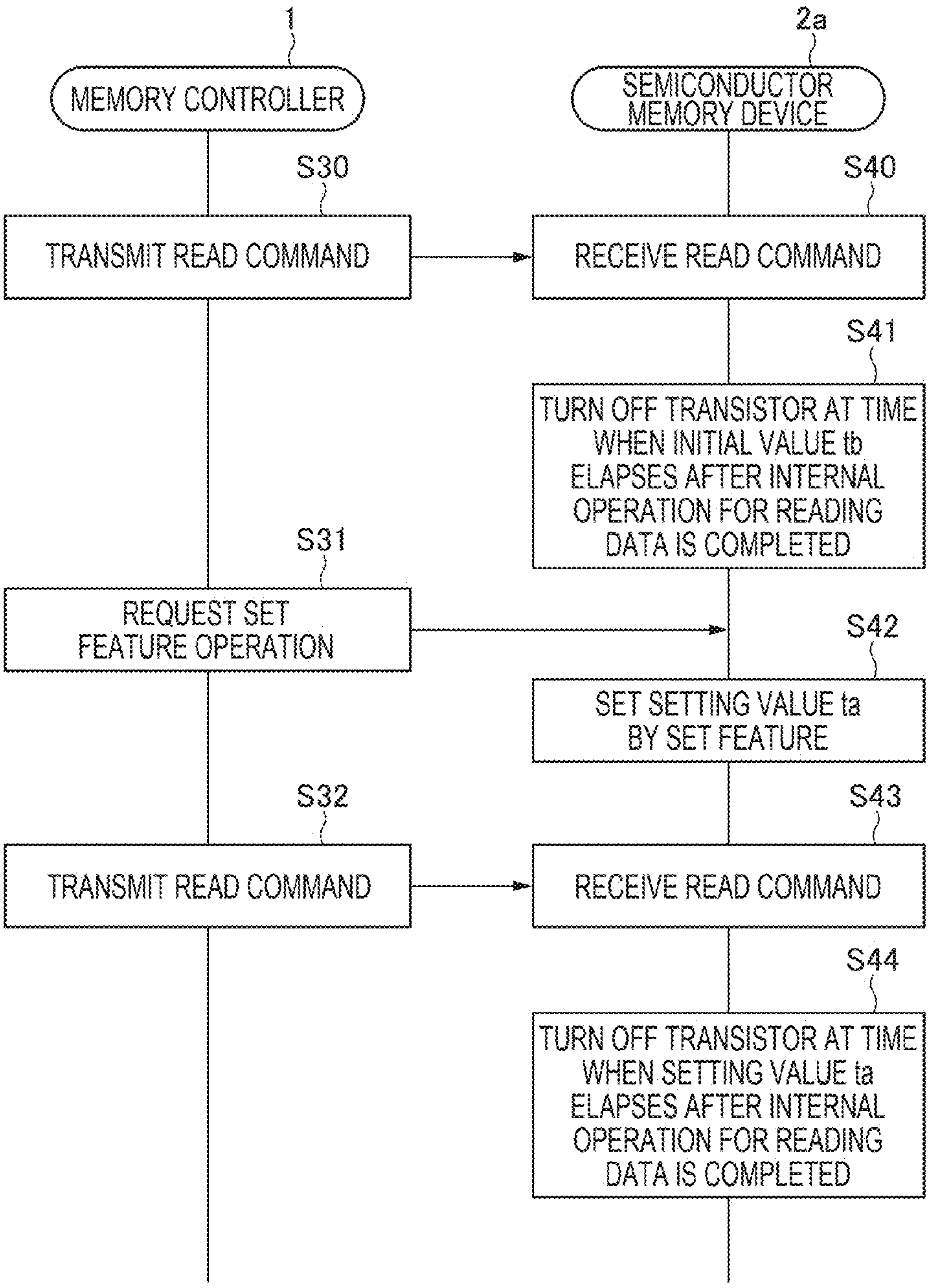
FIG. 17 is a sequence diagram illustrating an operation example of a memory system of another embodiment.

In the semiconductor memory device 2*a* in the embodiment, although it is possible to switch the standby time period tS to either the initial value tb or the setting value ta by whether or not to add the prefix command xxh as illustrated to FIG. 15, the switching method of the standby time period tS is not limited to this. For example, in the semiconductor memory device 2*a*, it may be possible to switch the standby time period tS to either the initial value tb or the setting value ta by the set feature. For example, when the standby time period tS is set to the initial value tb, as illustrated in FIG. 17, the memory controller 1 transmits a read command to the semiconductor memory device 2*a* (step S30), and when the read command is received by the semiconductor memory device 2*a* (step S40), in the semiconductor memory device 2*a*, at the time when the initial value tb elapses after the internal operation for reading data from the memory cell array 110 is completed, the transistors 65*a* and 65*b* are turned off (step S41). Thereafter, when the memory controller 1 requests a set feature operation to the semiconductor memory device 2*a* as illustrated in FIG. 13 (step S31), in the semiconductor memory device 2*a*, the standby time period tS is switched to the setting value ta by the set feature (step S42). After this, the memory controller 1 transmits the read command to the semiconductor memory device 2*a* (step S32), and when the read command is received by the semiconductor memory device 2*a* (step S43), in the semiconductor memory device 2*a*, at the time when the setting value ta elapses after the internal operation for reading data from the memory cell array 110 is completed, the transistors 65*a* and 65*b* are turned off (step S44). Note that, when it is desired to return the standby time period tS to the initial value tb after this, the memory controller 1 may switch the standby time period from the setting value ta to the initial value tb by the set feature. Note that the operations of the other semiconductor memory devices 2*b* to 2*d* are also basically the same.

In the semiconductor memory device 2*a* in the embodiment, the timing for turning off the transistors 65*a* and 65*b* may be appropriately changed. For example, the semiconductor memory device 2*a* in the embodiment, there is a case where, after the command set CSr of read operation is input from the memory controller 1, the internal operation for reading data is performed, and thereafter the data is output to the memory controller 1 based on the command set CSd of data out operation being further input from the memory controller 1. In such a case, in the semiconductor memory device 2*a*, when the standby time period tS elapses without starting data transfer to the memory controller 1 from the time at which the command set CSd of data out operation is input, that is, the time at which the signal consisting of "05h", a plurality of "ADD", and "E0h" is input, the transistors 65*a* and 65*b* may be turned off. When the configuration of the above-described embodiment is applied to such semiconductor memory device 2*a*, the standby time period tS can be changed according to an instruction from the memory controller 1. In other words, the semiconductor memory device 2*a* in the embodiment is configured such that, after the read operation or the data out operation as a first operation is instructed by the memory controller 1 (after the command set CSr of read operation or the command set CSd of data out operation is input), the standby time period tS for maintaining the data output standby state in which the read data temporarily stored by the latch circuits XDL is transferred to the first storage unit 510 and the input/output circuit 21 can be changed according to an instruction from the memory controller 1.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device, comprising:

a memory cell array;

a data storage unit that temporarily stores data read from the memory cell array;

a first terminal provided for transmitting the data read from the memory cell array to an external memory controller;

a second terminal provided for receiving a read control signal transmitted by the memory controller;

a data transfer circuit that is provided between the data storage unit and the first terminal, through which the data stored in the data storage unit is transferred to the first terminal;

a switching element through which power supplied to the data transfer circuit is controlled; and a control circuit configured to control the data transfer circuit and the switching element, wherein while executing a first operation instructed by the memory controller, when a predetermined time period elapses without receiving the read control signal from the memory controller after the data transfer circuit receives the data from the data storage unit, the control circuit controls the switching element to cut off the power supplied to the data transfer circuit, and the predetermined time period is changed according to an instruction from the memory controller.

2. The semiconductor memory device of claim 1, further comprising:

a first power supply voltage input terminal provided for receiving a first voltage; and a second power supply voltage input terminal provided for receiving a second voltage lower than the first voltage, wherein the data transfer circuit is supplied power through a current flowing through the data transfer circuit between the first power supply voltage input terminal and the second power supply voltage input terminal.

3. The semiconductor memory device of claim 2, wherein the switching element is provided between the data transfer circuit and the second power supply voltage input terminal.

4. The semiconductor memory device of claim 1, further comprising:

a register in which a setting value of the predetermined time period is stored, wherein the control circuit is configured to acquire the predetermined time period by reading the setting value from the register.

5. The semiconductor memory device of claim 4, wherein the setting value of the predetermined time period stored in the register is updated based on the instruction from the memory controller.

6. The semiconductor memory device of claim 1, wherein the control circuit selects as the predetermined time period an initial value or a setting value that is set by a user.

7. The semiconductor memory device of claim 1, further comprising:

a register in which a plurality of setting values of the predetermined time period are stored, wherein the control circuit selects as the predetermined time period one of the plurality of setting values.

8. The semiconductor memory device of claim 1, wherein the control circuit is configured to change the predetermined time period based on a predetermined command transmitted from the memory controller.

9. The semiconductor memory device of claim 1, wherein the data transfer circuit includes an input/output circuit capable of transmitting the data to the memory controller via the first terminal; and a FIFO circuit configured to perform a first-in first-out operation on the data received from the data storage unit.

10. The semiconductor memory device of claim 1, further comprising:

a monitor circuit configured to monitor an operating state of the data transfer circuit, wherein the control circuit is configured to calculate a recommended value of the predetermined time period based on the operating state of the data transfer circuit.

11. The semiconductor memory device of claim 10, wherein the control circuit is configured to output the recommended value of the predetermined time period to the memory controller.

12. A memory system comprising:

the semiconductor memory device of claim 11; and a memory controller configured to control the semiconductor memory device based on a request from a host, wherein the memory controller outputs the recommended value of the predetermined time period to the host.

13. The semiconductor memory device of claim 1, wherein the first operation is a read operation.

14. The semiconductor memory device of claim 1, wherein the first operation is a data out operation.

15. A semiconductor memory device, comprising:

a memory cell array;

a first terminal provided for transmitting data to an external memory controller;

a first power supply voltage input terminal provided for receiving a first voltage;

a second power supply voltage input terminal provided for receiving a second voltage lower than the first voltage;

a data transfer circuit that is provided between the memory cell array and the first terminal, through which the data is transferred to the first terminal;

a switching element connected between the first power supply voltage input terminal and the second power supply voltage input terminal, through which power supplied to the data transfer circuit is controlled; and a control circuit configured to control the data transfer circuit and the switching element, wherein after the data transfer circuit receives the data, when there is no transfer of the data to the first terminal for a predetermined time period, the control circuit controls the switching element to cut off the power supplied to the data transfer circuit, and the predetermined time period is changed according to an instruction from the memory controller.

16. The semiconductor memory device of claim 15, further comprising:

a register in which a setting value of the predetermined time period is stored, wherein the control circuit is configured to acquire the predetermined time period by reading the setting value from the register, and the setting value of the predetermined time period stored in the register is updated based on the instruction from the memory controller.

17. The semiconductor memory device of claim 15, wherein the data transfer circuit includes an input/output circuit capable of transmitting the data to the memory controller via the first terminal; and a FIFO circuit configured to perform a first-in first-out operation on the data received.

18. The semiconductor memory device of claim 17, wherein the data is received as a result of a read operation that is carried out in response to an instruction from the memory controller.

19. The semiconductor memory device of claim 17, wherein the data is received as a result of a data out operation that is carried out in response to an instruction from the memory controller.

20. The semiconductor memory device of claim 15, wherein the data transfer circuit is between the first power supply voltage input terminal and the switching element, and the switching element is between the data transfer circuit and the second power supply voltage input terminal.

* * * * *